(12) United States Patent
Hisamune

(10) Patent No.: US 6,274,432 B1
(45) Date of Patent: Aug. 14, 2001

(54) METHOD OF MAKING CONTACTLESS NONVOLATILE SEMICONDUCTOR MEMORY DEVICE HAVING BURIED BIT LINES SURROUNDED BY GROOVED INSULATORS

(75) Inventor: Yosiaki Hisamune, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/535,735

(22) Filed: Mar. 27, 2000

Related U.S. Application Data

(62) Division of application No. 08/939,947, filed on Sep. 29, 1997, now Pat. No. 6,057,574.

(30) Foreign Application Priority Data

Sep. 30, 1996 (JP) .................................................. 8-257249

(51) Int. Cl.[7] .............................................. H01L 21/8247
(52) U.S. Cl. ........................... 438/259; 438/589; 438/263
(58) Field of Search .................................. 438/259, 262, 438/263, 270, 589, 593, 594

(56) References Cited

U.S. PATENT DOCUMENTS

| Re. 35,810 | 5/1998 | Prall | 438/259 |
|---|---|---|---|
| 5,460,989 | * 10/1995 | Wake | 438/589 |
| 5,534,456 | 7/1996 | Yuan et al. | 438/263 |
| 5,773,343 | 6/1998 | Lee et al. | 438/259 |
| 5,854,501 | 12/1998 | Kao | 438/259 |
| 5,880,499 | * 3/1999 | Oyama | 438/259 |

FOREIGN PATENT DOCUMENTS

| 62-72171 | 4/1987 | (JP) . |
|---|---|---|
| 3-1574 | 1/1991 | (JP) . |
| 3-233974 | 10/1991 | (JP) . |
| 4-218975 | 8/1992 | (JP) . |
| 6-104451 | * 4/1994 | (JP) . |
| 6-283721 | 10/1994 | (JP) . |
| 8-051164 | 2/1996 | (JP) . |
| 8-107155 | 4/1996 | (JP) . |
| 8-186183 | 7/1996 | (JP) . |
| 8-241932 | 9/1996 | (JP) . |

OTHER PUBLICATIONS

J. Esquivel et al., "High density contactless, self aligned EPROM cell array technology", pp. 592–595, IEDM Technical Digest, 1986.

* cited by examiner

Primary Examiner—Chandra Chaudhari
(74) Attorney, Agent, or Firm—Yougn & Thompson

(57) ABSTRACT

In a contactless nonvolatile semiconductor memory device including a semiconductor substrate and a plurality of impurity diffusion layers of a rectangular shape serving as sub bit lines on the semiconductor substrate, a plurality of grooves of a rectangular shape are formed in the semiconductor substrate between the impurity diffusion layers. Also, a first gate insulating layer is formed on the semiconductor substrate within the grooves, and a plurality of floating gate electrodes are formed on the first insulating layer. Further, a second gate insulating layer is formed on the floating gate electrodes, and a plurality of word lines are formed on the second gate insulating layer.

14 Claims, 53 Drawing Sheets

US 6,274,432 B1

METHOD OF MAKING CONTACTLESS NONVOLATILE SEMICONDUCTOR MEMORY DEVICE HAVING BURIED BIT LINES SURROUNDED BY GROOVED INSULATORS

CROSS-REFERENCE TO RELATED APPLICATION

This application is a division of application Ser. No. 08/939,947, now U.S. Pat. No. 6,057,574 filed Sep. 29, 1997.

BACKGROUND OF THE INVENTION

1. Field of the Invention

The present invention relates to a contactless nonvolatile semiconductor memory device.

2. Description of the Related Art

In a nonvolatile semiconductor memory device such as a flash electrically-erasable programmable read-only memory (EEPROM) or an electrically programmable read-only memory (EPROM), the integration has been advanced by constructing bit lines as buried impurity diffusion layers.

In a prior art contactless nonvolatile semiconductor memory device, buried impurity diffusion layers as bit lines are formed beneath thick insulating layers (see J. Esquivel et al., "High Density Contactless, Self-aligned EPROM Cell Array Technology", IEDM Technical Digest, pp. 592–595, 1986). This will be explained later in detail.

In the above-mentioned prior art contactless nonvolatile semiconductor memory device, however, when the integration is advanced so that a spacing between the buried impurity diffusion layers becomes narrow, leakage currents flowing therebetween are increased, which invites a malfunction of nonvolatile memory cells. Also, this creates a serious short channel effect.

In addition, when patterning floating gate electrodes by a dry etching process, the buried impurity diffusion layers are also etched. As a result, the resistance of the buried impurity diffusion layers is increased, which reduces the read operation speed of the device.

SUMMARY OF THE INVENTION

It is an object of the present invention to reduce the leakage currents between buried impurity diffusion layers serving as bits lines in a contactless semiconductor memory device.

Another object of the present invention is to suppress the short channel effect of memory cells.

A further object of the present invention is to avoid the etching of the buried impurity diffusion layers.

According to the present invention, in a contactless nonvolatile semiconductor memory device including a semiconductor substrate and a plurality of impurity diffusion layers serving as sub bit lines of a rectangular shape on the semiconductor substrate, a plurality of grooves of a rectangular shape are formed in the semiconductor substrate between the impurity diffusion layers. Also, a first gate insulating layer is formed on the semiconductor substrate within the grooves, and a plurality of floating gate electrodes are formed on the first gate insulating layer. Further, a second gate insulating layer is formed on the floating gate electrodes, and a plurality of word lines are formed on the second gate insulating layer. Thus, the distance between the buried impurity diffusion layers is increased by the presence of the grooves, which reduces leakage currents therebetween.

Also, a plurality of insulating layers are formed on the buried impurity diffusion layers. Thus, when patterning floating gate electrodes, the buried impurity diffusion layers are hardly etched due to the presence of the insulating layers thereon.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments, a prior art contactless nonvolatile semiconductor memory device will be explained with reference to FIGS. 1, 2, 3A and 3B (see J. Esquivel et al., "High Density Contactless, Self-aligned EPROM Cell Array Technology", IEDM Technical Digest, pp. 592–595, 1986).

Figure 1:
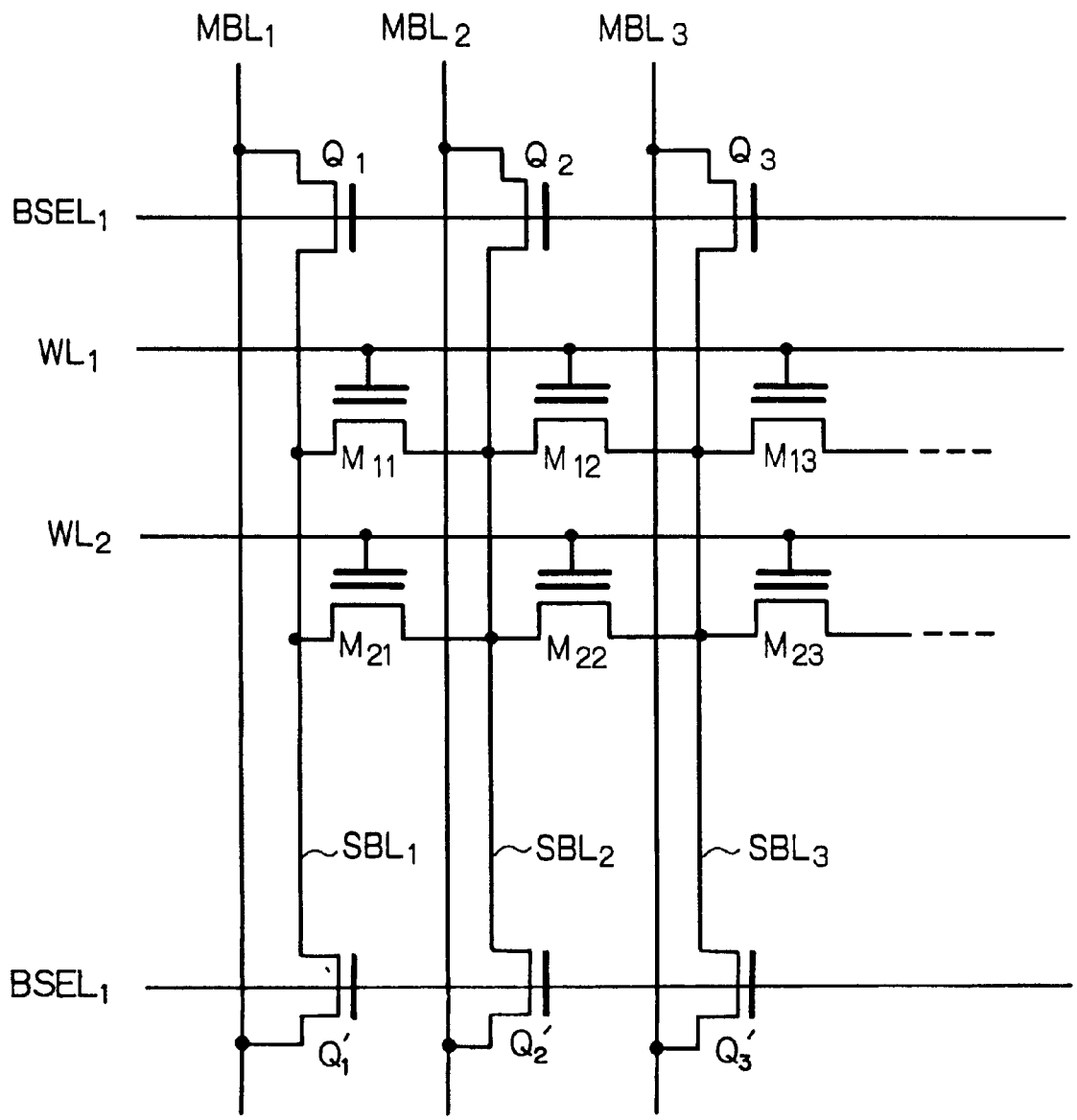
FIG. 1 is an equivalent circuit diagram illustrating a prior art contactless nonvolatile semiconductor memory device.

In FIG. 1, which is an equivalent circuit diagram illustrating a prior art contactless virtual ground type nonvolatile semiconductor memory device, references $WL_1$, $WL_2$, . . . designate word lines; $MBL_1$, $MBL_2$, . . . designate main bit line lines; $SBL_1$, $SBL_1$, . . . designate sub bit lines arranged along with the main bit lines $MBL_1$, $MBL_2$, . . . , respectively; and $M_{11}$, $M_{12}$, $M_{13}$, . . . , $M_{21}$, $M_{22}$, $M_{23}$, . . . designate floating gate type nonvolatile memory cells each connected to one of the word lines $WL_1$, $WL_2$, . . . and one of the sub bit lines $SBL_1$, $SBL_2$, . . . . The main bit lines $MBL_1$, $MBL_2$, . . . are formed by conductive layers, while the sub bit lines $SBL_1$, $SBL_2$, . . . are formed by buried impurity diffusion regions in a semiconductor substrate. The sub bit lines $SBL_1$, $SBL_2$, . . . are connected to the main bit lines $MBL_1$, $MBL_2$, . . . , respectively, via switching transistors $Q_1, Q_2, \ldots, Q_1', Q_2', \ldots$ which are turned ON and OFF by a block selection signal $BSEL_1$.

Figure 2:
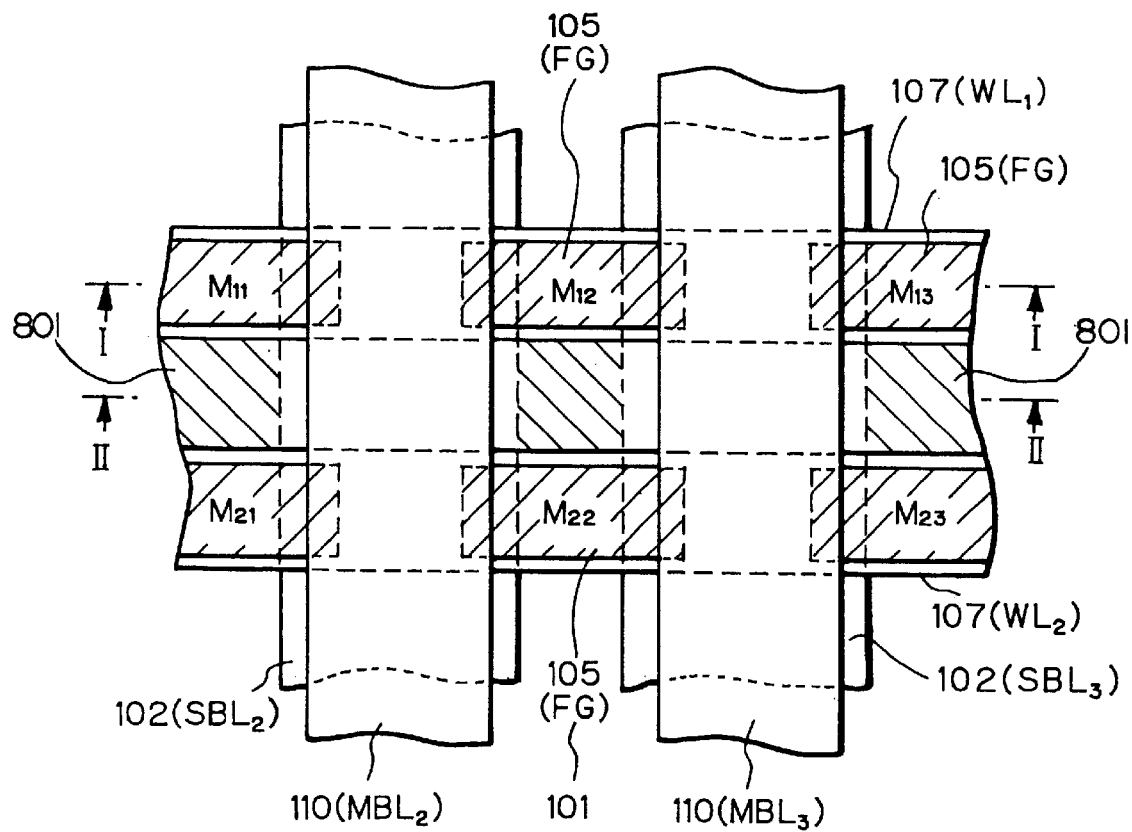
FIG. 2 is a plan view of the device of FIG. 1.
Figure 3A:
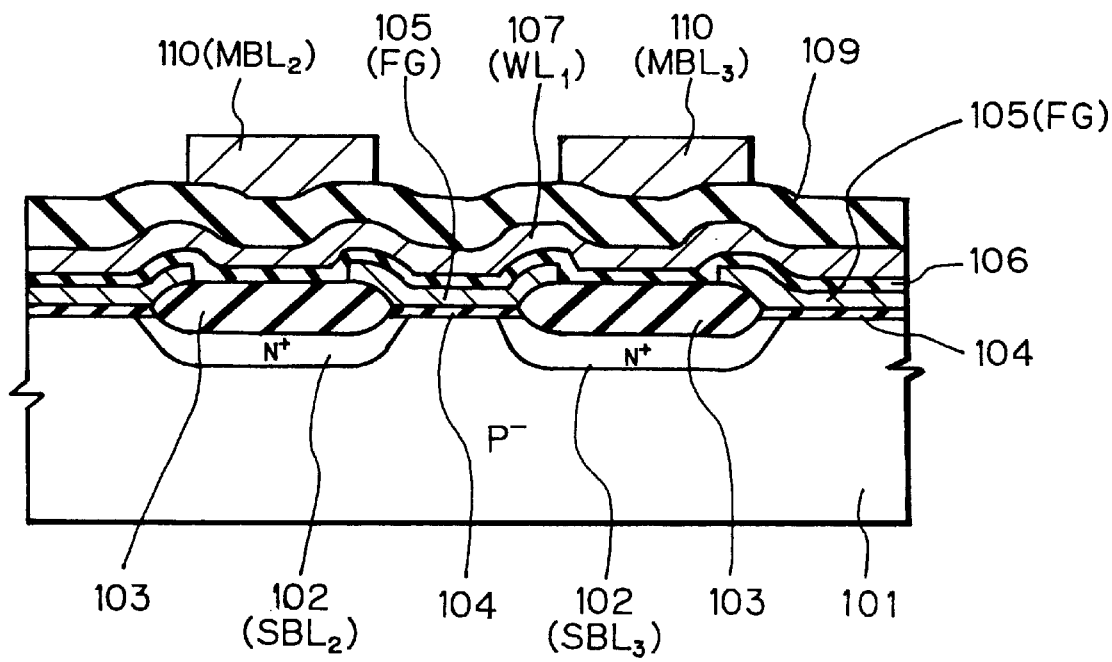
FIGS. 3A and 3B are cross-sectional views taken along the lines I—I and II—II, respectively, of FIG. 1.
Figure 3B:
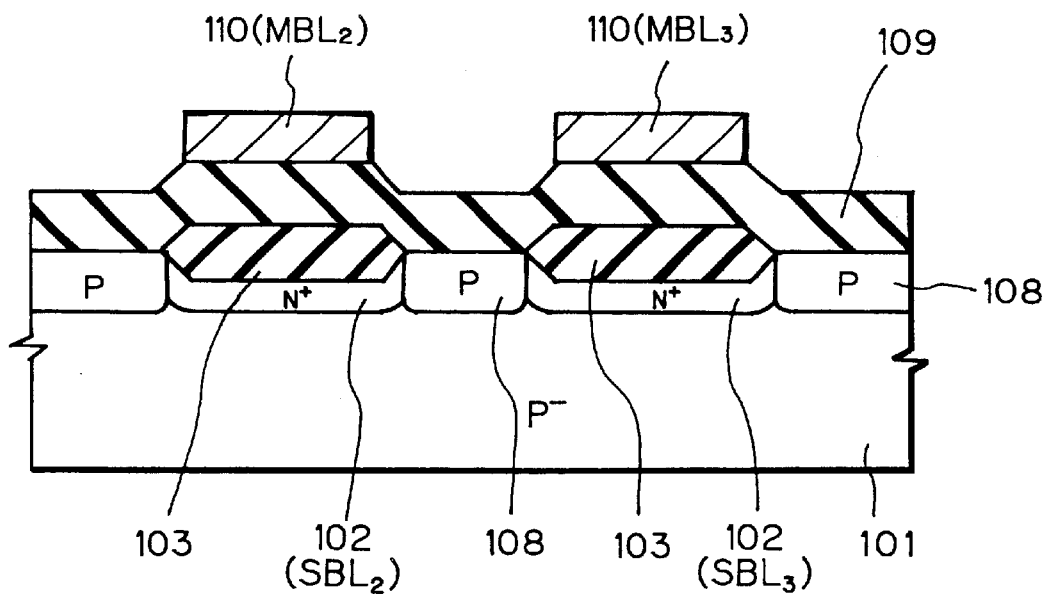

The nonvolatile memory cells $M_{11}$, $M_{12}$, $M_{21}$ and $M_{22}$ of FIG. 1 are explained next with reference to FIGS. 2, 3A and 3B. Here, FIG. 2 is a plan view of the nonvolatile memory cells $M_{11}, M_{12}, M_{13}, M_{21}, M_{22}$ and $M_{22}$ of FIG. 1, and FIGS. 3A and 3B are cross-sectional views taken along the lines I—I and II—II, respectively, of FIG. 2.

That is, $N^+$-type impurity diffusion regions 102 are formed (as the sub bit lines $SBL_2$ and $SBL_3$) within a $P^-$-type silicon substrate 101. Also, a thick silicon oxide layer 103 is formed on the $N^+$-type impurity diffusion regions 102. Further, a gate silicon oxide layer 104 and a conductive layer 105 serving as floating gate electrodes FG are formed on the silicon substrate 101. In addition, a gate silicon oxide layer 106 and a conductive layer 107 serving as word lines $WL_1$, $WL_2$ as well as control gates CG are formed. Further, P-type channel stopper regions 108 are formed within the silicon substrate 101 between the floating gate electrodes FG. Finally, an insulating layer 109 and a conductive layer 110 serving as the main bit lines $MBL_2$ and $MBL_3$ are formed.

In the prior art contactless nonvolatile semiconductor memory device of FIGS. 1, 2, 3A and 3B, however, when the integration is advanced so that a spacing between the $N^+$-type impurity diffusion regions 102 ($SBL_2$, $SBL_3$) becomes narrow, leakage currents flowing therebetween are increased, which invites a malfunction of the nonvolatile memory cells $M_{11}$, $M_{12}$, . . . . Also, this creates a serious short channel effect.

In addition, when the conductive layer 107 ($WL_1$, $WL_2$, CG) is patterned by a dry etching process, the conductive layer 105 (FG) is also patterned in self-alignment with the conductive layer 107. In this case, since the thickness of the gate silicon oxide layer 104 on the $N^+$-type impurity diffusion regions 102 ($SBL_2$, $SBL_3$) is insufficient, the $N^+$-type impurity diffusion of regions 102 ($SBL_2$, $SBL_3$) are partly etched by the above-mentioned dry etching process. As a result, the resistance of the $N^+$-type impurity diffusion regions 102 ($SBL_2$, $SBL_3$) is increased, which reduces the read operation speed of the device.

Figure 4:
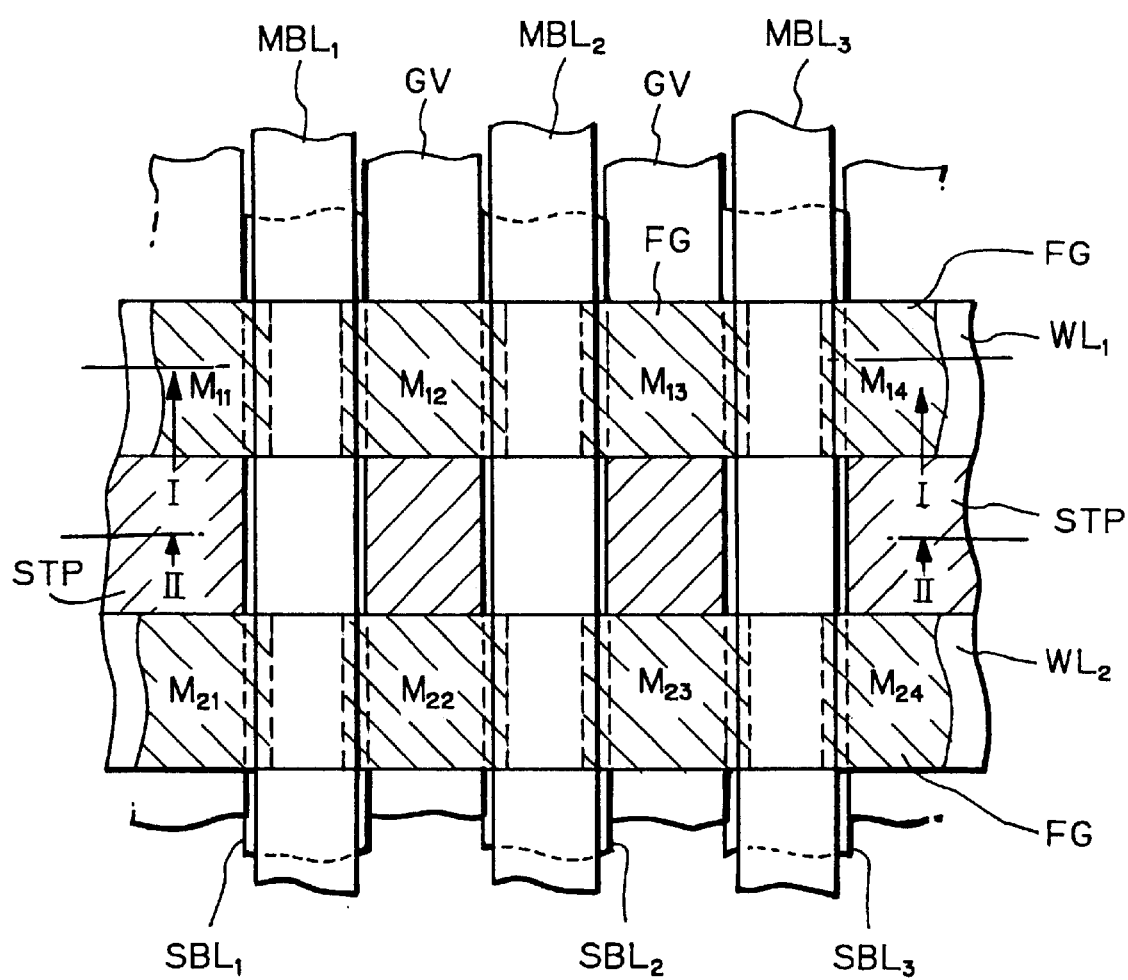
FIG. 4 is a plan view illustrating a first embodiment of the contactless nonvolatile semiconductor memory device according to the present invention.

In FIG. 4, which is a plan view illustrating a first embodiment of the present invention, a contactless virtual ground type nonvolatile semiconductor device whose equivalent circuit is also illustrated in FIG. 1. Grooves GV are provided between sub bit lines $SBL_1$, $SBL_2$, $SBL_3$, . . . which are also formed by buried impurity layers. As a result, a distance between the sub bit lines $SBL_1$, $SBL_2$, $SBL_3$, . . . is increased substantially, and thus, leakage currents therebetween can be decreased, even if an erase voltage is increased. In addition, since insulating layers (not shown) are formed completely on the sub bit lines $SBL_1$, $SBL_2$, $SBL_3$, . . . , when patterning floating gate electrodes FG by a dry etching process, the sub bit lines $SBL_1$, $SBL_2$, $SBL_3$, . . . are hardly etched.

In FIG. 4, note that references $WL_1$, $WL_2$, . . . designate word lines, and STP desingnates a channel stopper.

A first method for manufacturing the contactless virtual ground type nonvolatile semiconductor memory device of FIG. 4 is explained next with reference to FIGS. 5A, 5B, 6A, 6B, 7A, 7B, 8A, 8B, 9A, 9B, 10A, 10B, 11A, 11B, 12A, 12B, 13A, 13b, 14A, 14B, 15A, 15B, 16A, 16B, 17A and 17B. Note that FIGS. 5A through 17A are cross-sectional views taken along the line I—I of FIG. 4, and FIGS. 5B through 17B are cross-sectional views taken along the line II—II of FIG. 4.

Figure 5A:
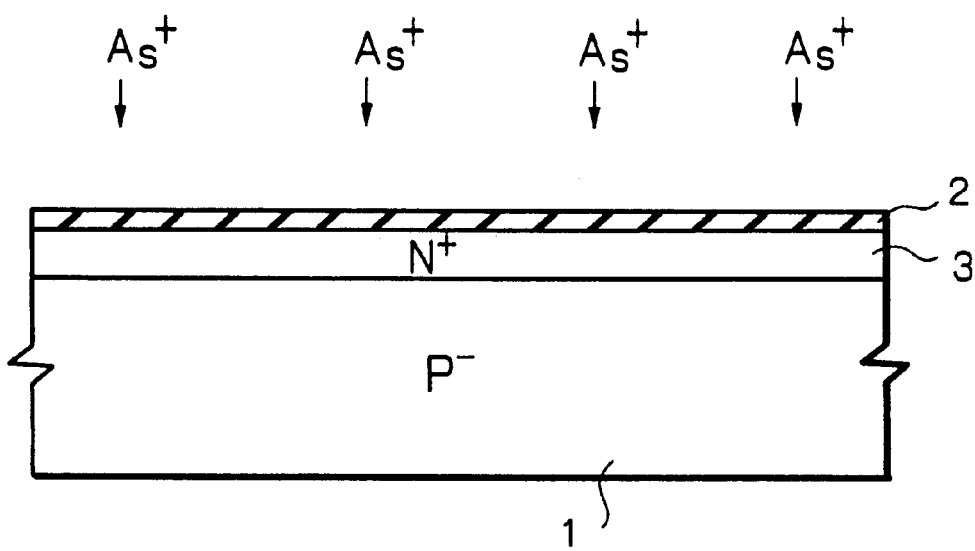
FIGS. 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A and 17B are cross-sectional views showing a first method for manufacturing the device of FIG. 4.
Figure 5B:
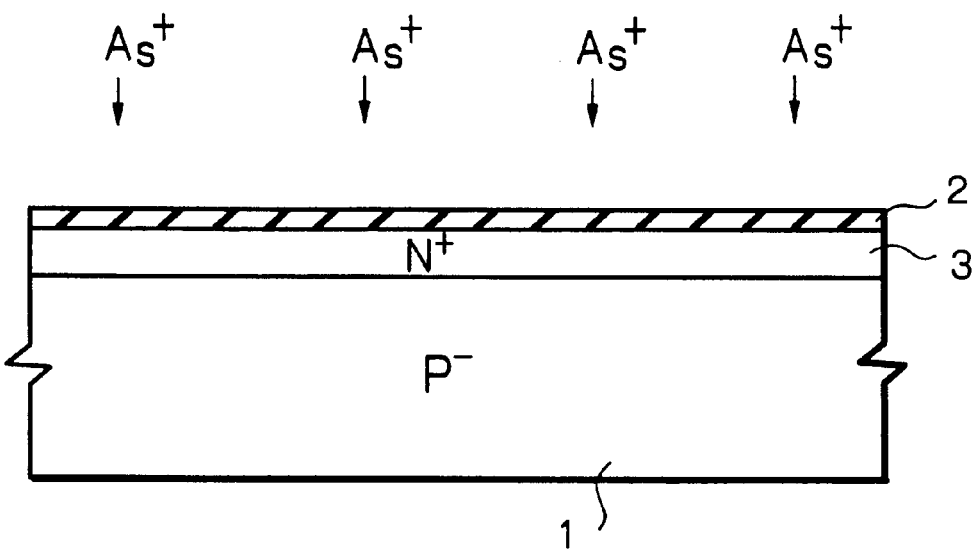

First, referring to FIGS. 5A and 5B, an about 10 to 20 nm thick silicon oxide layer 2 is formed on a $P^-$-type silicon substrate 1 by using a thermal oxidation process or a chemical vapor deposition process (CVD) process. Then, about $1 \times 10^{15}$ to $7 \times 10^{15}$ arsenic ions/cm$^3$ are implanted at an energy of about 50 keV into the silicon substrate 1, and an annealing operation is performed thereupon. Thus, an $N^+$-type impurity diffusion layer 3 is formed.

Figure 6A:
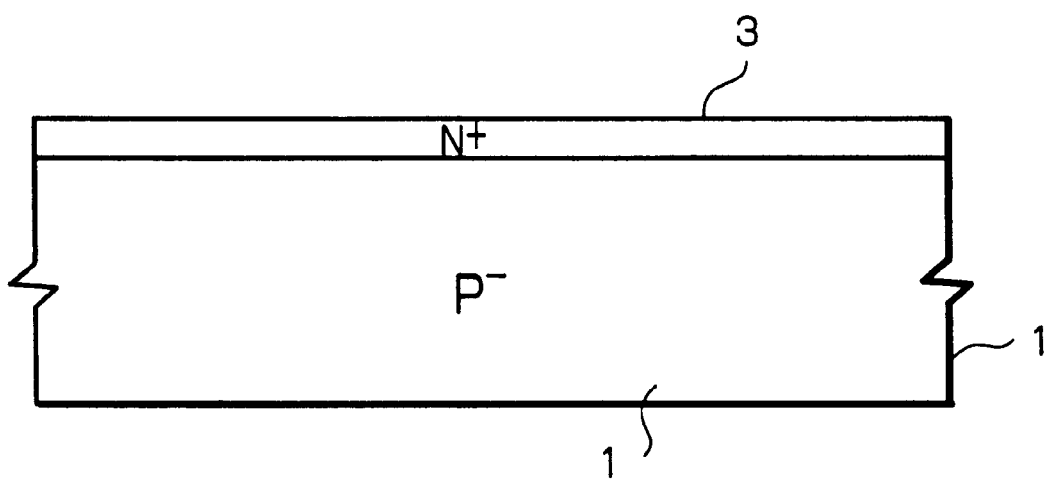
Figure 6B:
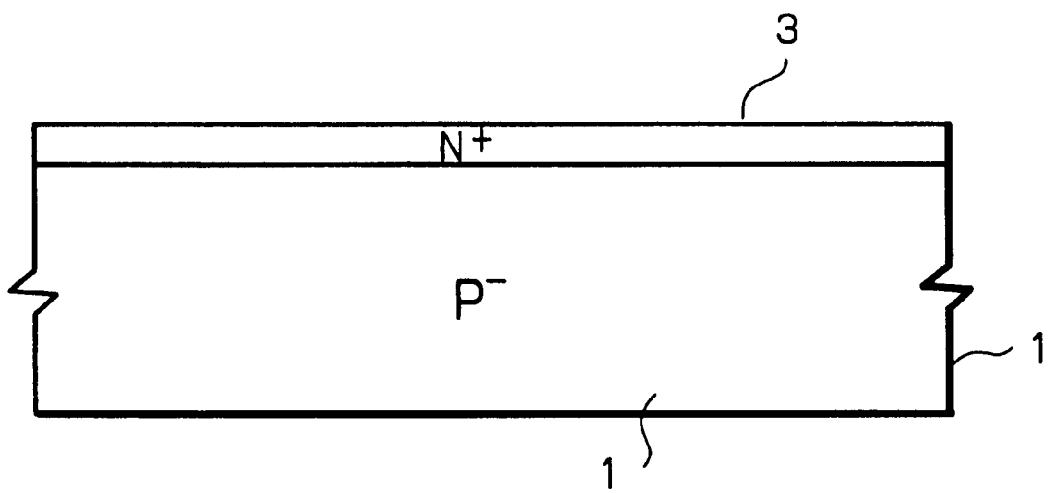

Next, referring to FIGS. 6A and 6B, the silicon oxide layer 2 is removed.

Figure 7A:
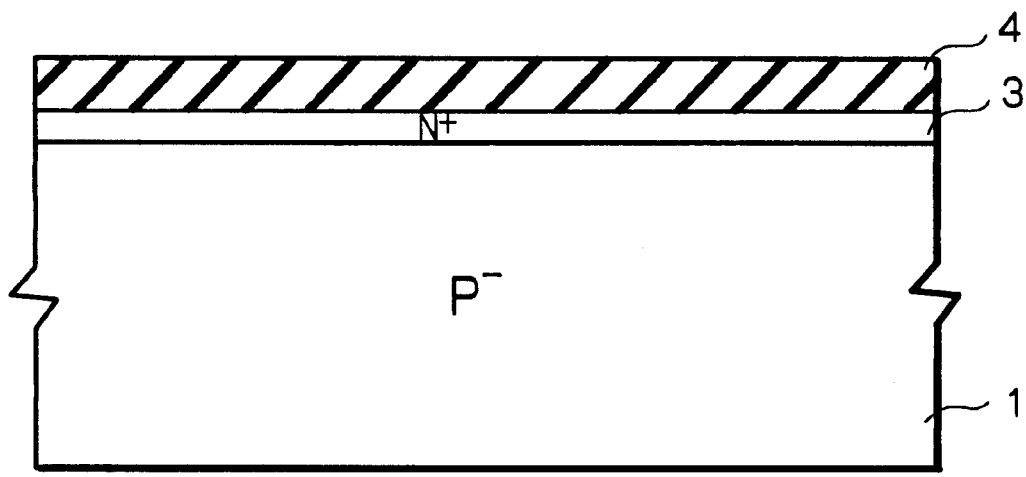
Figure 7B:
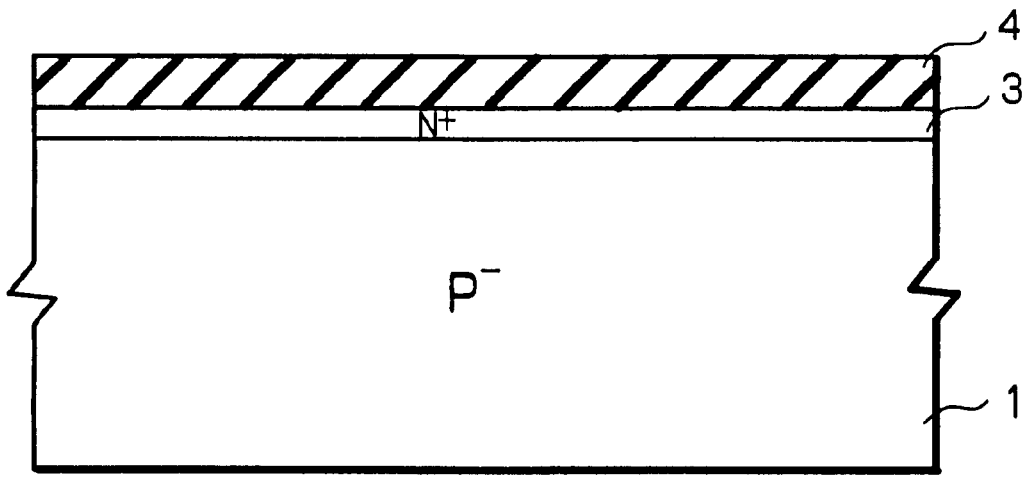

Next, referring to FIGS. 7A and 7B, an about 200 to 500 nm thick silicon oxide layer 4 is deposited on the $N^+$-type impurity diffusion layer 3.

Figure 8A:
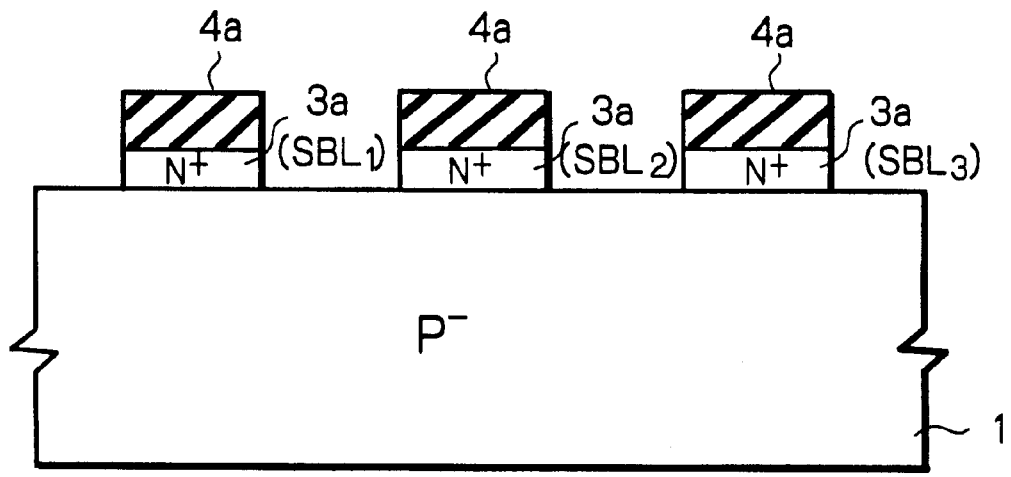
Figure 8B:
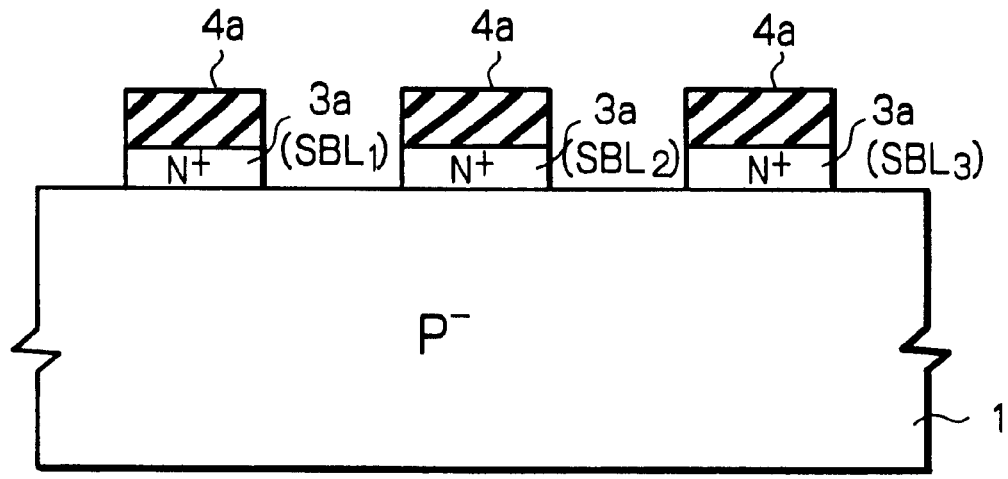

Next, referring to FIGS. 8A and 81, the silicon oxide layer 4 and the $N^+$-type impurity diffusion layer 3 are patterned by a photolithography and reactive ion etching (RIE) process. As a result, patterned $N^+$-type impurity diffusion layers 3a are in self-alignment with patterned silicon oxide layers 4a. In this case, the $N^+$-type impurity diffusion layers 3a are of a rectangular shape and form the sub bit lines $SBL_1$, $SBL_2$, and $SBL_3$ of FIG. 4.

Subsequently, referring to FIGS. 9A and 9B, the silicon substrate 1 is further etched by the above-mentioned RIE process using the silicon oxide layers 4a as a mask. As a result, grooves 5 of a rectangular shape viewed from the top, i.e., the grooves GV of FIG. 4 are formed in self-alignment with the silicon oxide layers 4a.

Figure 10A:
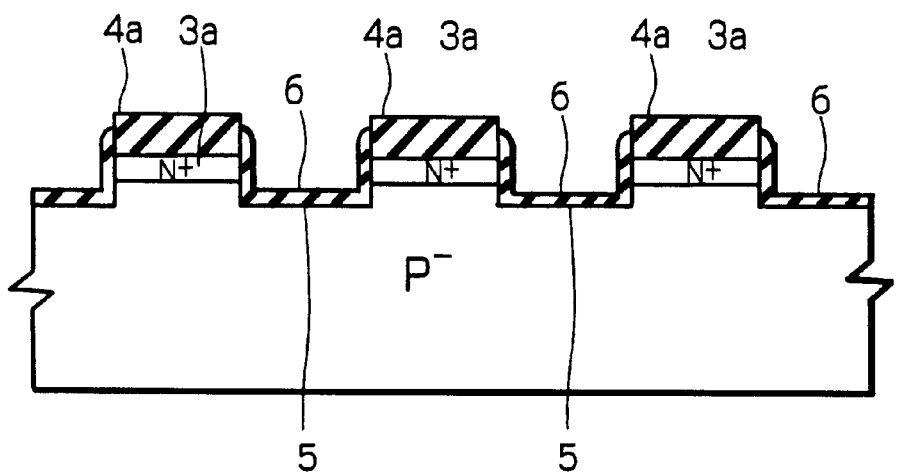
Figure 10B:
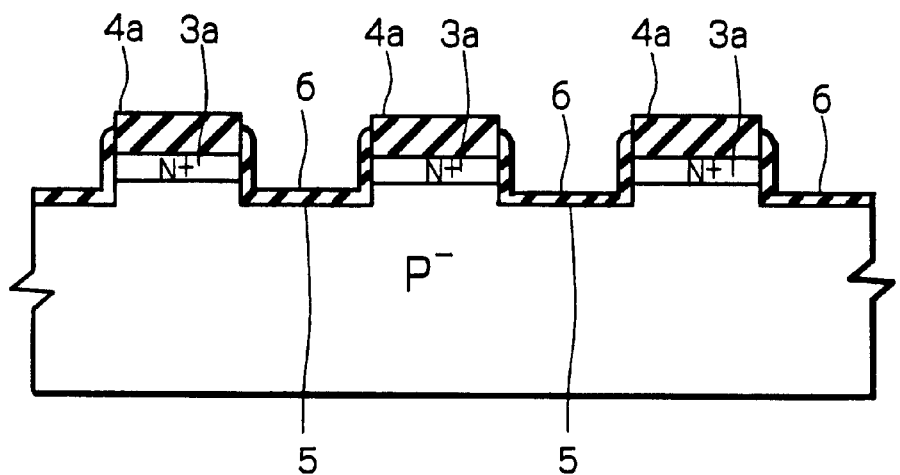

Next, referring to FIGS. 10A and 10B, a thermal oxidation operation is carried out, so that an about 7 to 10 nm thick gate silicon oxide layer 6 is formed.

Figure 11A:
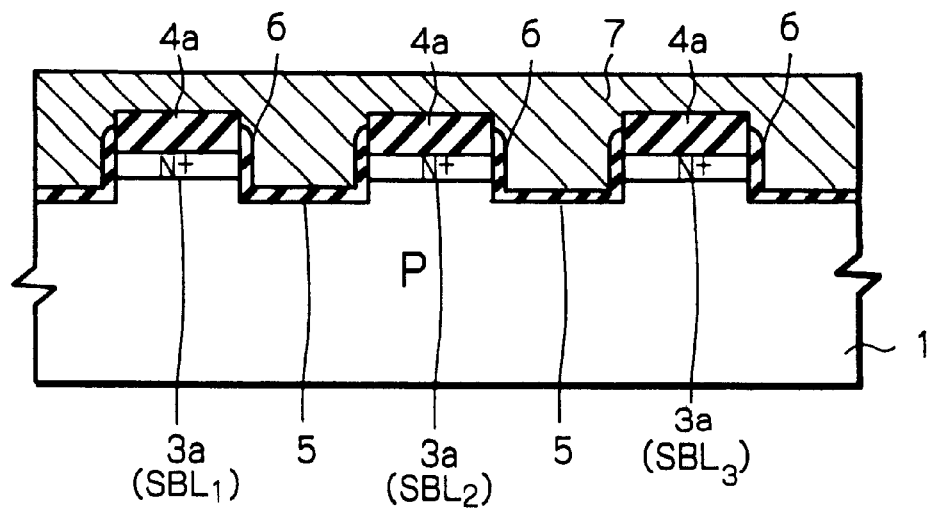
Figure 11B:
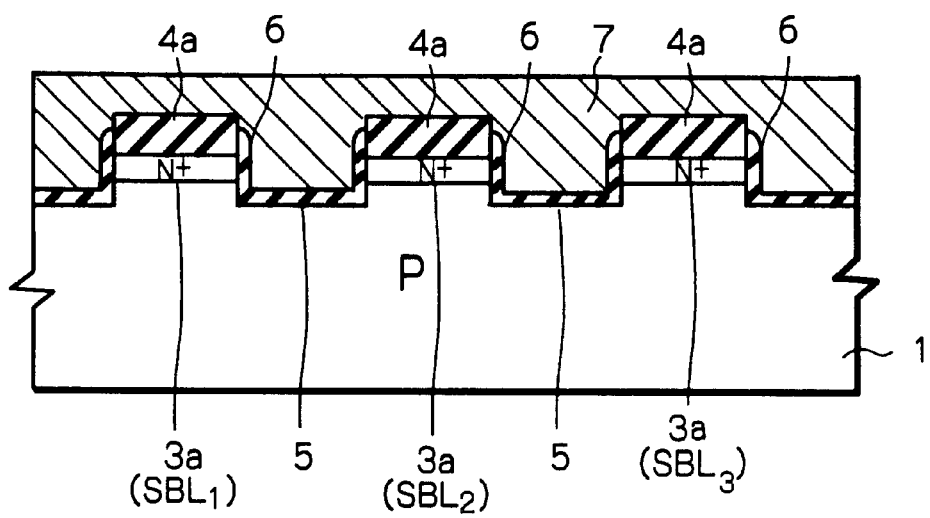

Next, referring to FIGS. 11A and 11B, a polycrystalline silicon layer 7 including phosphorus is deposited by a CVD process on the entire surface.

Figure 12A:
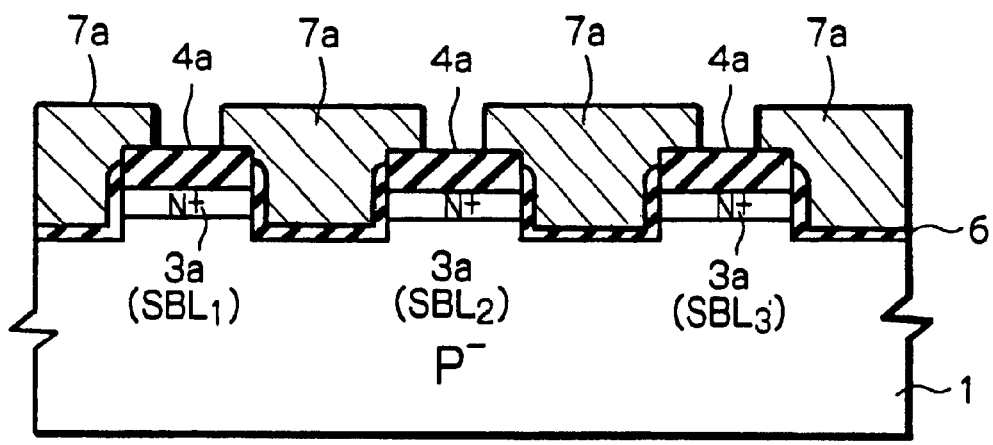
Figure 12B:
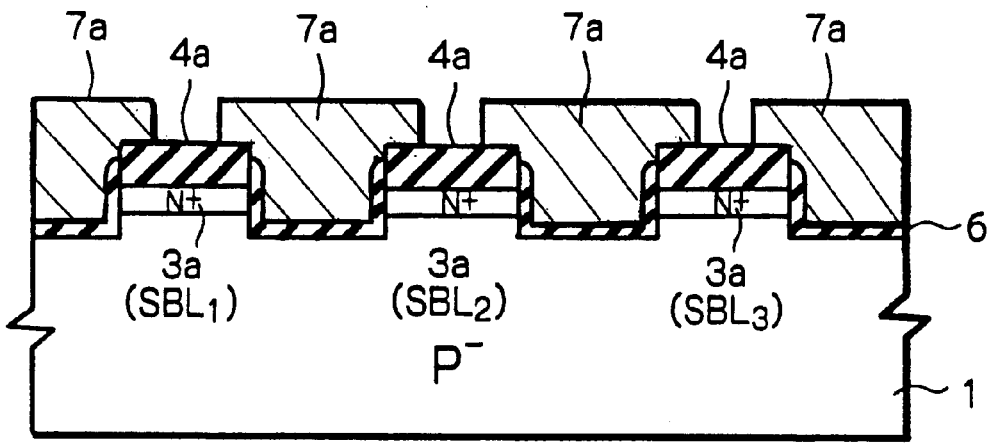

Next, referring to FIGS. 12A and 12B, the polycrystalline silicon layer 7 is patterned by a photolithography and etching process, so that polycrystalline silicon layers 7a of a rectangular shape viewed from the top are formed.

Figure 13A:
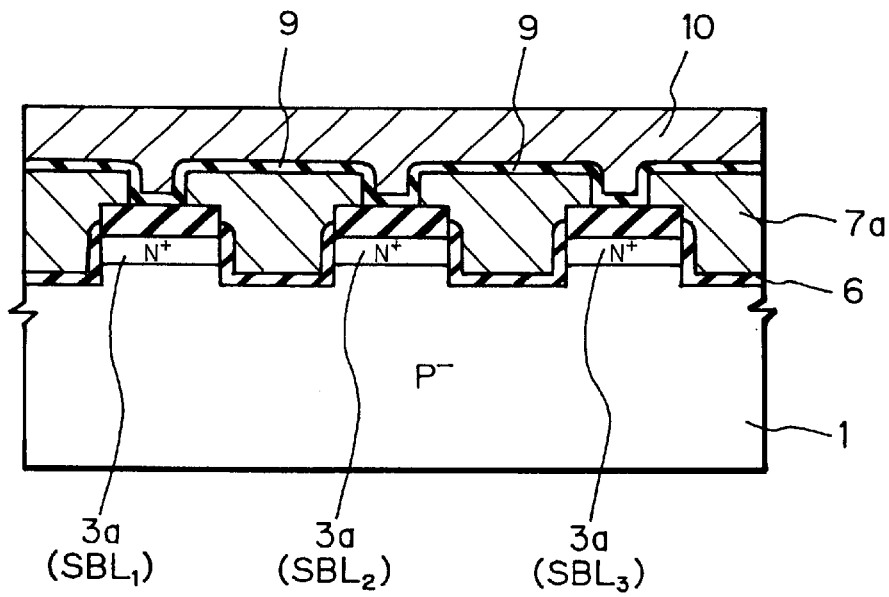
Figure 13B:
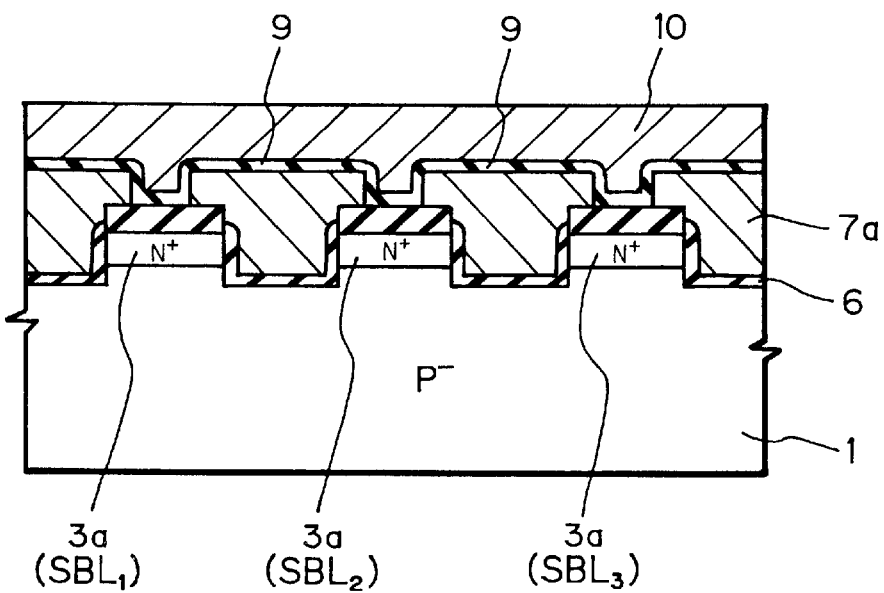

Next, referring to FIGS. 13A and 13B, a gate insulating layer 9 made of silicon oxide/silicon nitride/silicon oxide (ONO) is formed on the entire surface, and a polycrystalline silicon layer 10 including phosphorus is deposited on the gate insulating layer 9 by a CVD process.

Figure 14A:
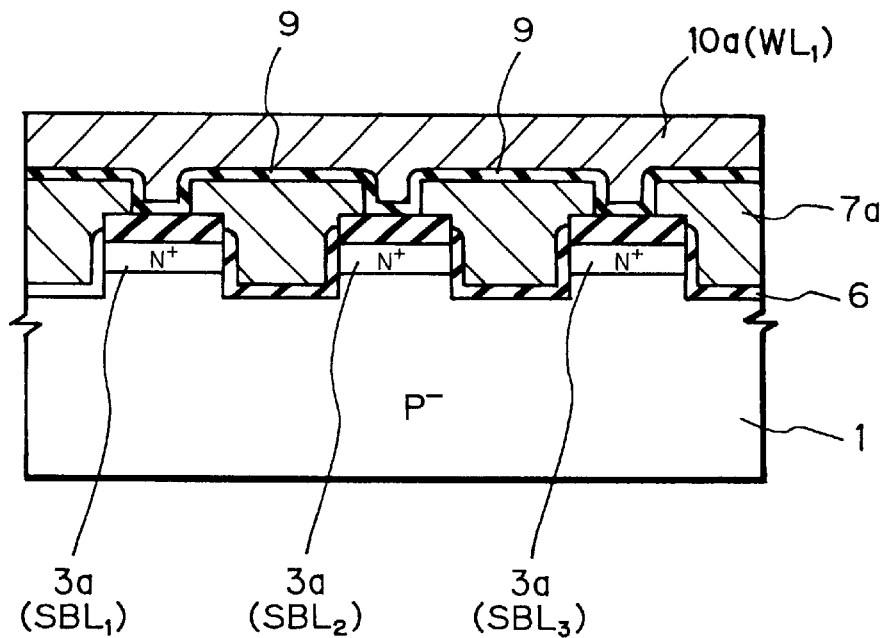
Figure 14B:
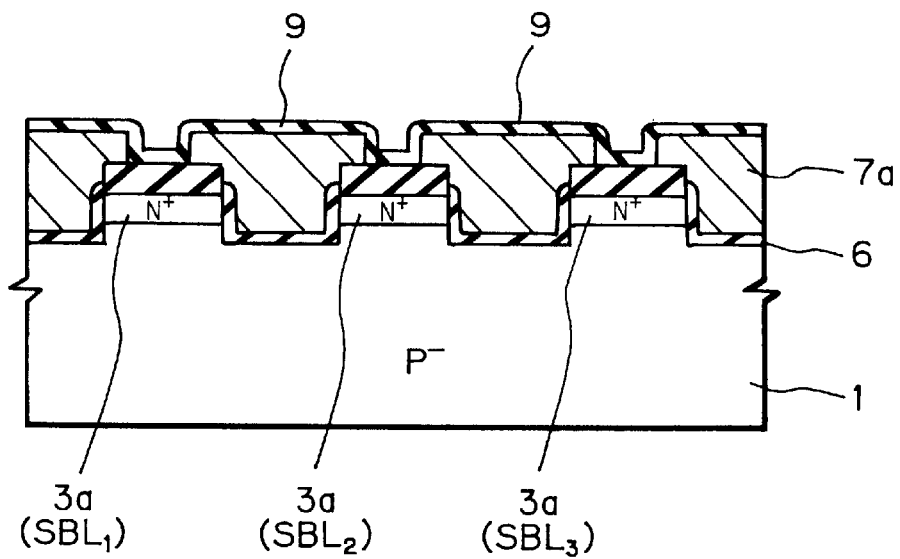

Next, referring to FIGS. 14A and 14B, the polycrystalline silicon layer 10 is patterned by a photolithography and dry etching process. As a result, patterned polycrystalline silicon layers 10a, i.e., the word lines $WL_1$ and $WL_2$ of FIG. 4 are obtained.

Figure 15A:
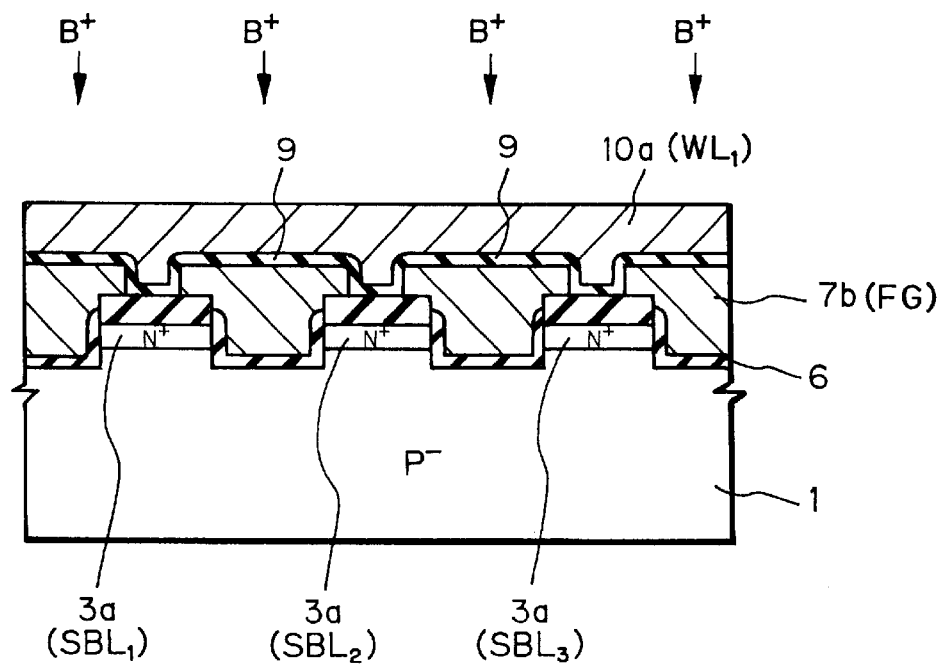
Figure 15B:
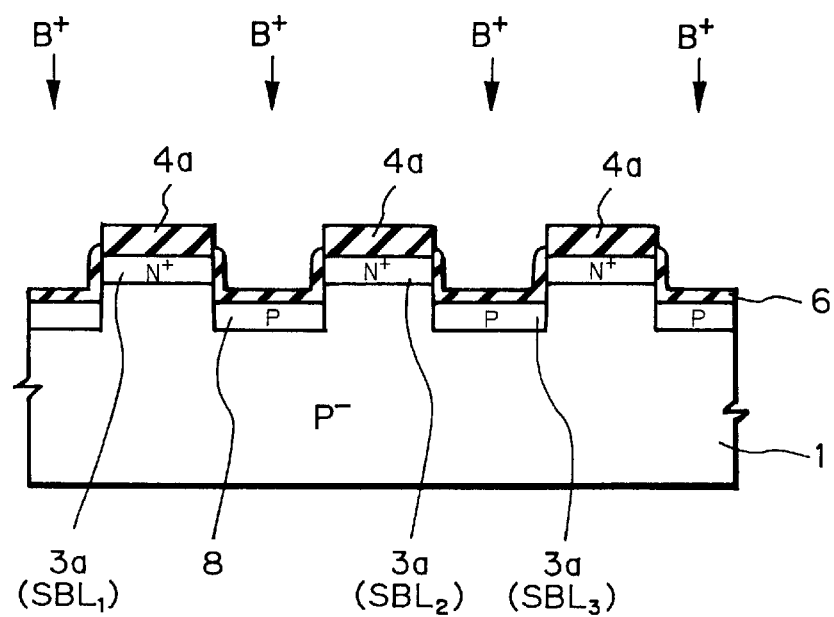

Next, referring to FIGS. 15A and 15B, the polycrystalline silicon layers 7a are further etched by a dry etching process by using with the polycrystalline silicon layers 10a (the word lines $WL_1$) as a mask. As a result, patterned polycrystalline silicon layers 7b, i.e., the floating gate electrodes FG of FIG. 4 are obtained. Then, about $1 \times 10^{13}$ boron ions/cm$^2$ are implanted at an energy of about 30 keV by using the polycrystalline silicon layers 10a ($WL_1$, $WL_2$) and the silicon oxide layers 4a as a mask. Thereafter, an annealing operation is carried out. As a result, P-type channel stopper layers 8, i.e., the channel stopper layers STP of FIG. 4 are formed.

Figure 16A:
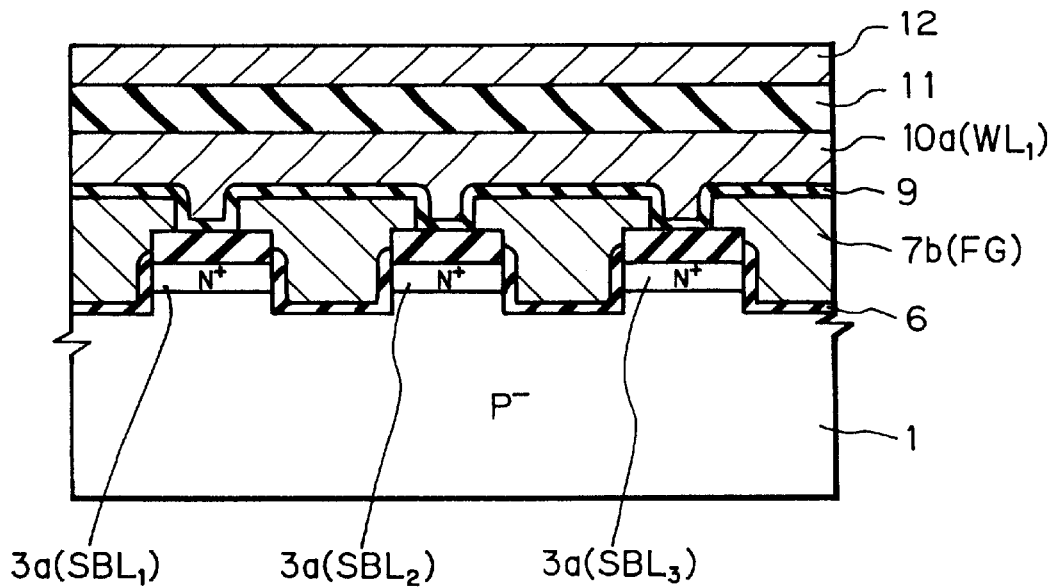
Figure 16B:
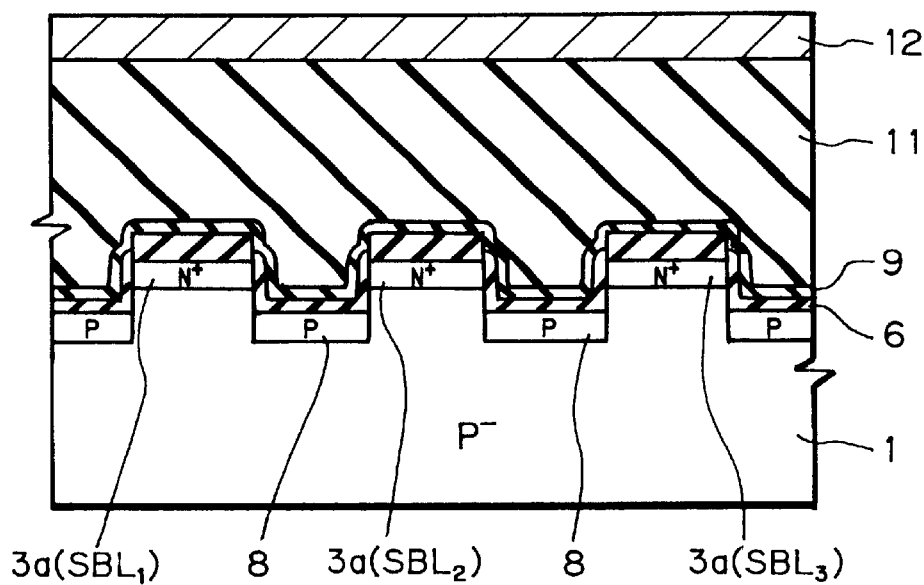

Next, referring to FIGS. 16A and 16B, a thick silicon oxide later 11 is deposited by a CVD process, and ther, a chemical mechanical polishing (CMP) operation is performed on the silicon oxide layer 11. Thus, the surface of the silicon oxide layer 11 is flattened. Then, an aluminum layer 12 is deposited on the silicon oxide layer 11 by a sputtering process.

Figure 17A:
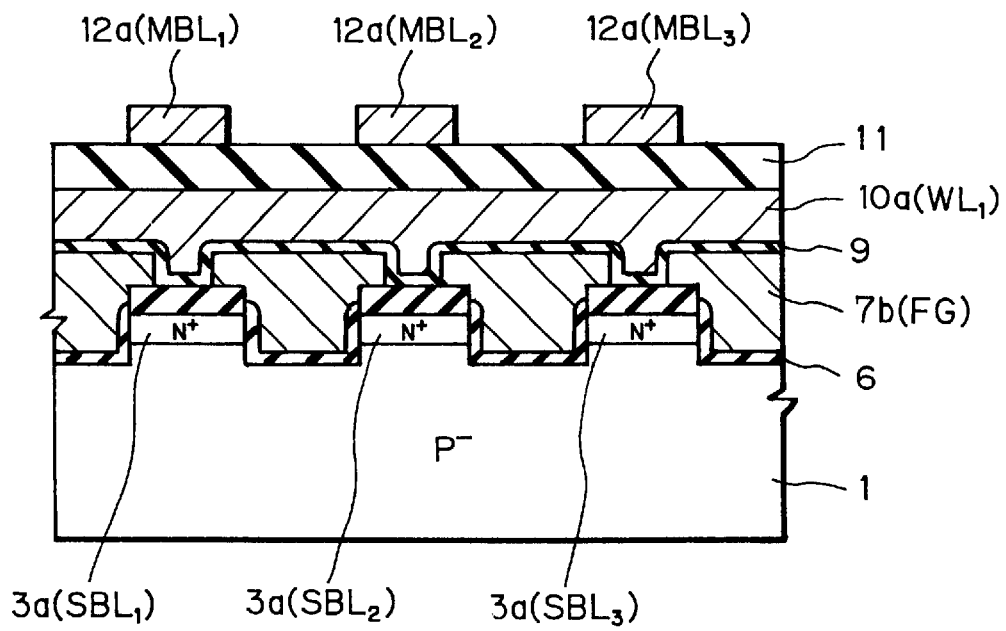
Figure 17B:
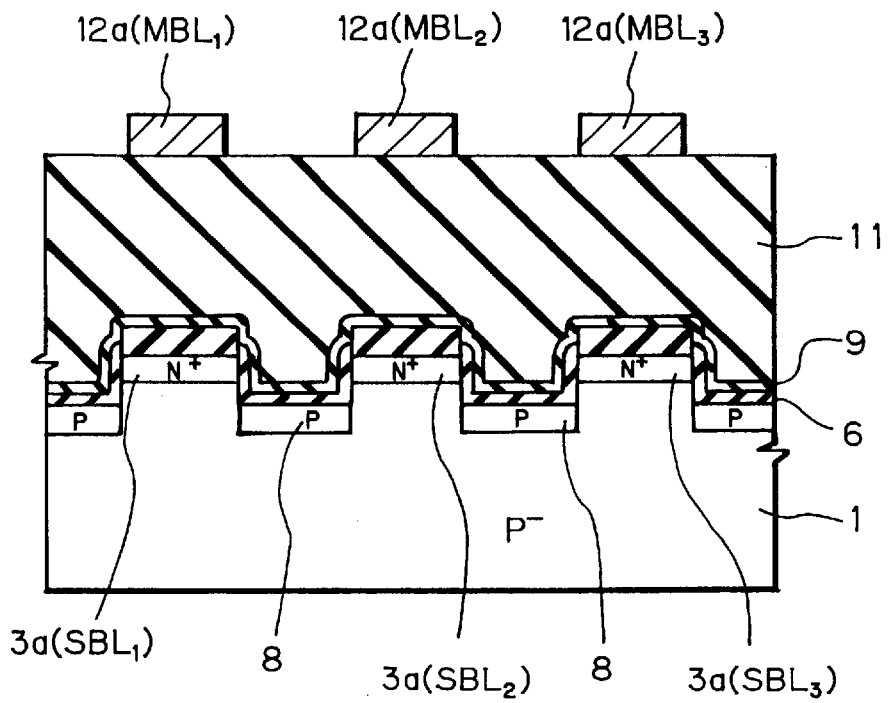

Finally, referring to FIGS. 17A and 17B, the aluminum layer 12 is patterned by a photolithography and etching process, so that patterned aluminum layers 12a, i.e., the main bit lines $MBL_1$, $MBL_2$ and $MBL_3$ of FIG. 4 are obtained.

Thus, the contactless virtual ground type nonvolatile semiconductor device of FIG. 4 is completed.

A second method for manufacturing the contactless virtual ground type nonvolatile semiconductor memory device of FIG. 4 is explained next with reference to FIGS. 18A, 18B, 19A, 19B, 20A, 20B, 21A, 21B, 22A, 22B, 23A, 23B, 24A, 24B, 25A, 25B, 26A, 26b, 27A, 27B, 28A, 28B, 29A, 29B, 30A, 30B, 31A and 31B. Note that FIGS. 18A through 31A are cross-sectional views taken along the line I—I of FIG. 4, and FIGS. 18B through 31B are cross-sectional views taken along the line II—II of FIG. 4.

Figure 18A:
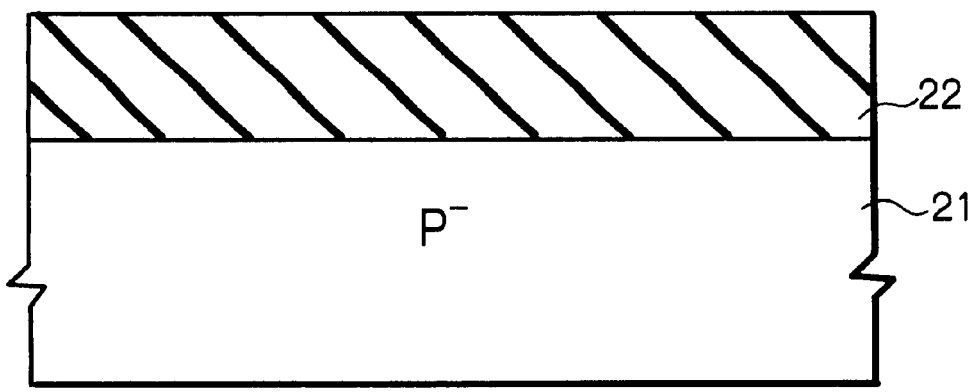
FIGS. 18A, 18B, 19A, 19B, 20A, 20B, 21A, 21B, 22A, 22B, 23A, 23B, 24A, 24B, 25A, 25B, 26A, 26B, 27A, 27B, 28A, 28B, 29A, 29B, 30A, 30B, 31A and 31B are cross-sectional views showing a second method for manufacturing the device of FIG. 4.
Figure 18B:
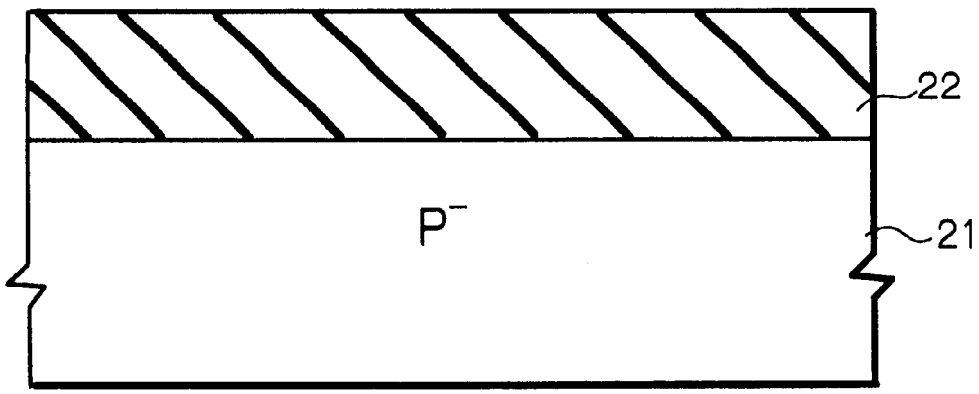

First, referring to FIGS. 18A and 18B, a silicon oxide layer 22 is grown on a silicon substrate 21.

Figure 9A:
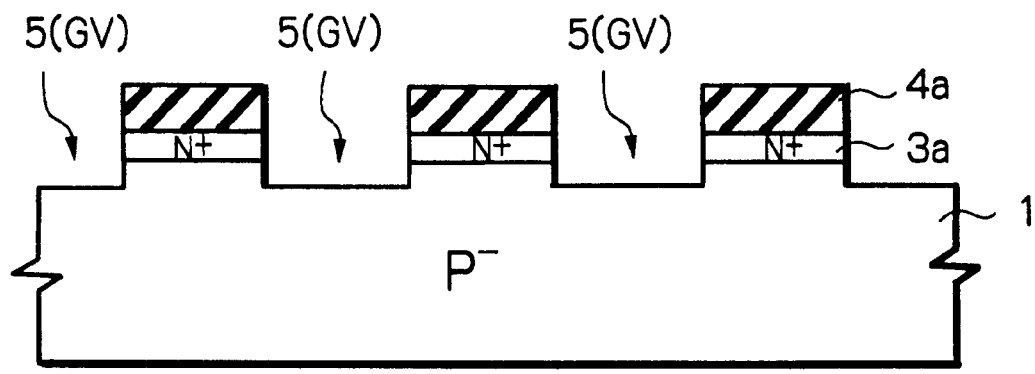
Figure 9B:
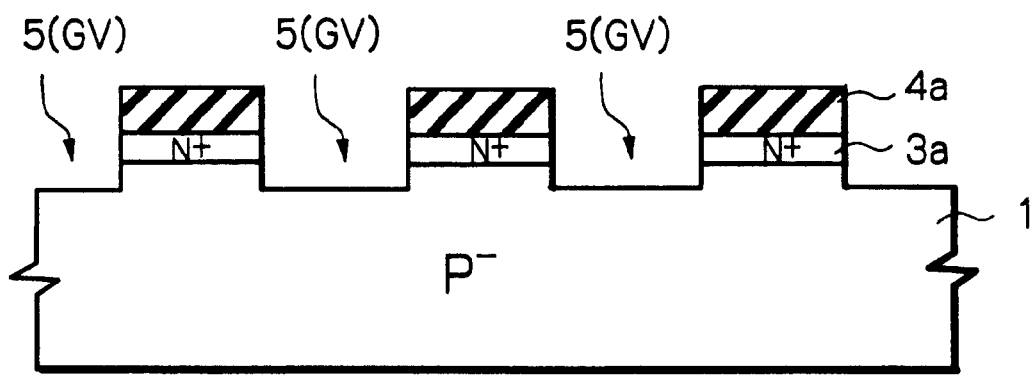
Figure 19A:
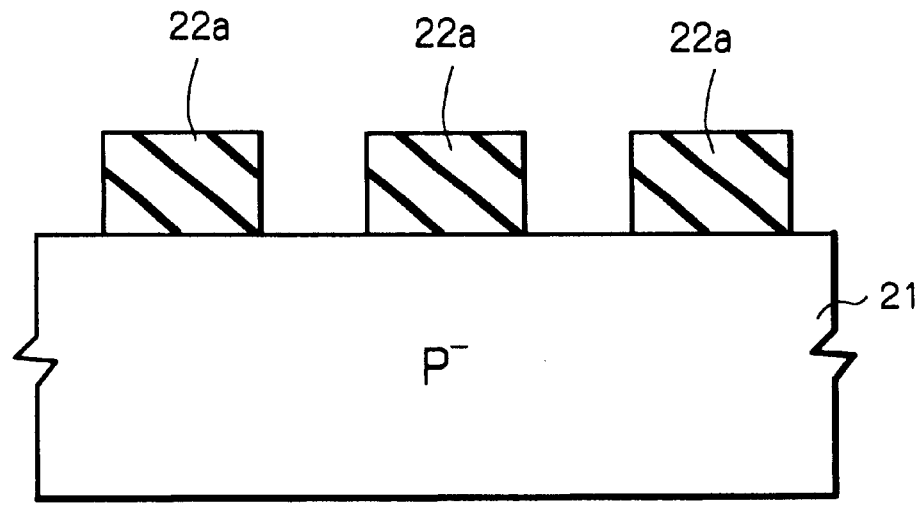
Figure 19B:
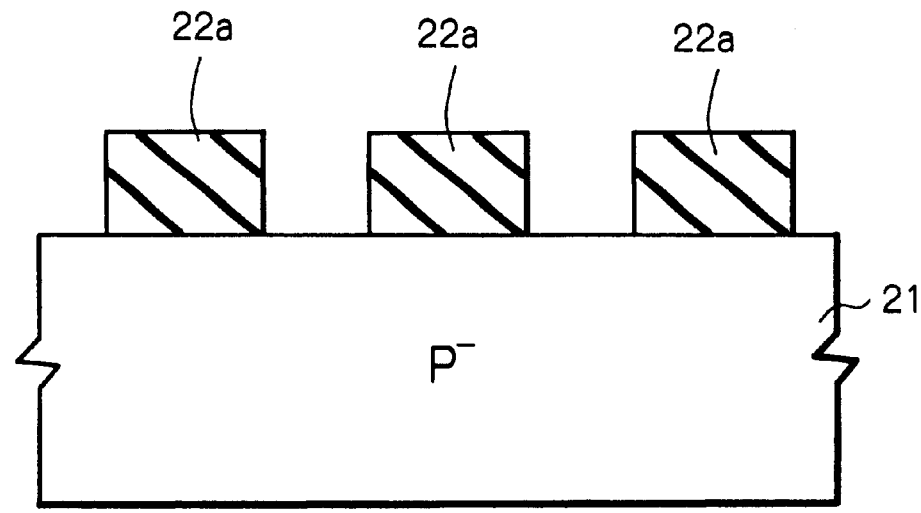

Next, referring to FIGS. 9A and 19B, the silicon oxide layer 22 is patterned by a photolithography and etching process, so that patterned silicon oxide layers 22a are formed.

Figure 20A:
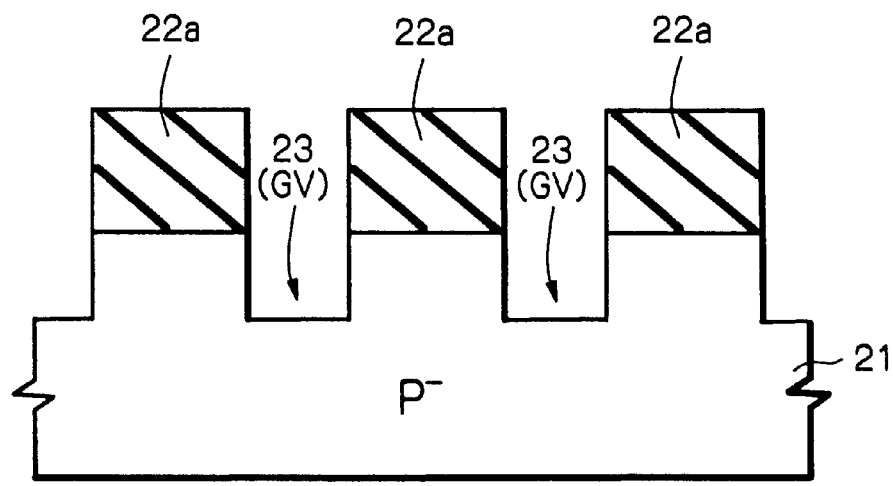
Figure 20B:
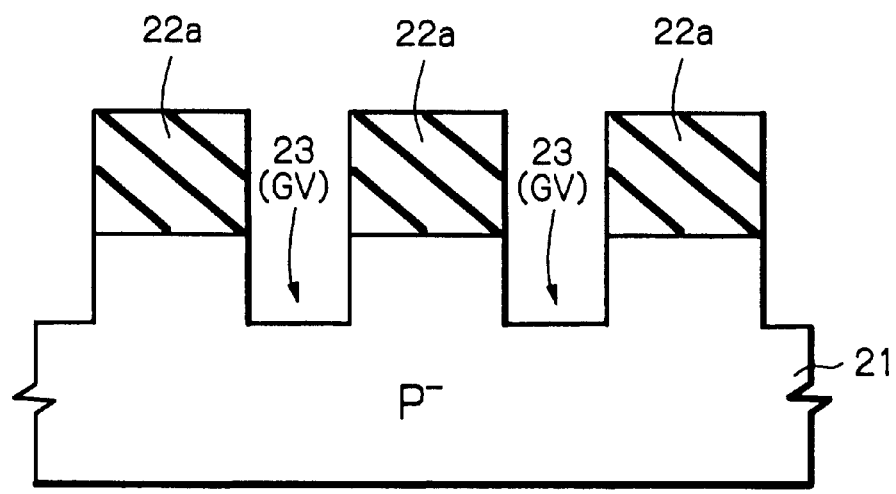

Next, referring to FIGS. 20A and 20B, the silicon substrate 21 is etched by an RIE process using the silicon oxide layers 22a as a mask. As a result, grooves 23 of a rectangular shape viewed from the top, i.e., the grooves GV of FIG. 4 are formed in self-alignment with the silicon oxide layers 22a. Then, the silicon oxide layers 22a are removed.

Figure 21A:
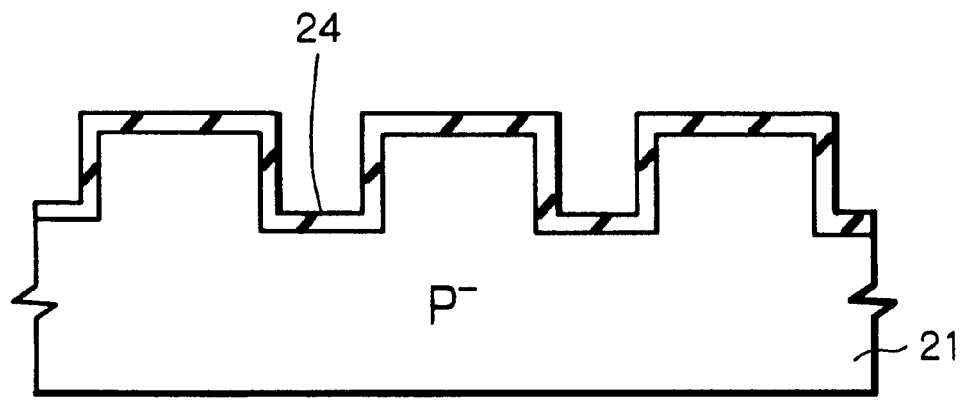
Figure 21B:
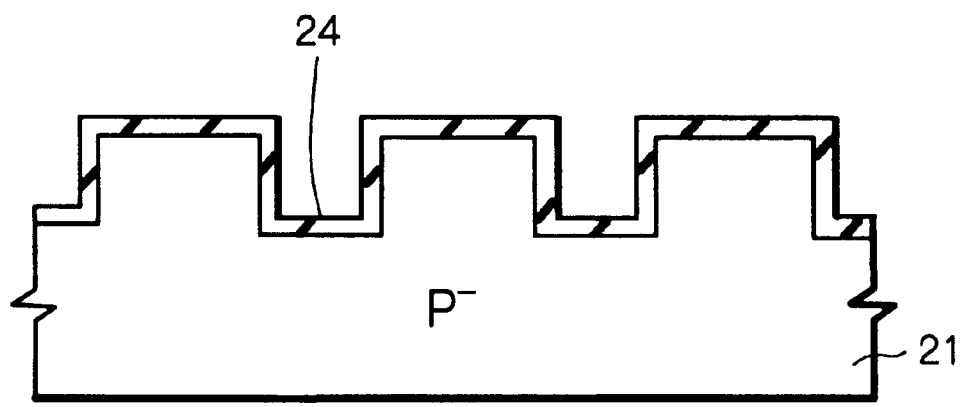

Next, referring to FIGS. 21A and 21B, a thermal oxidation operation is carried out, so that an about 7 to 10 nm thick gate silicon oxide layer 24 is formed.

Figure 22A:
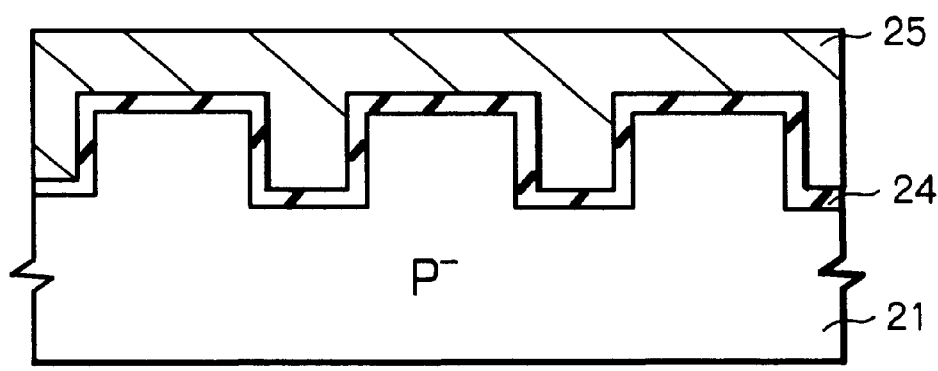
Figure 22B:
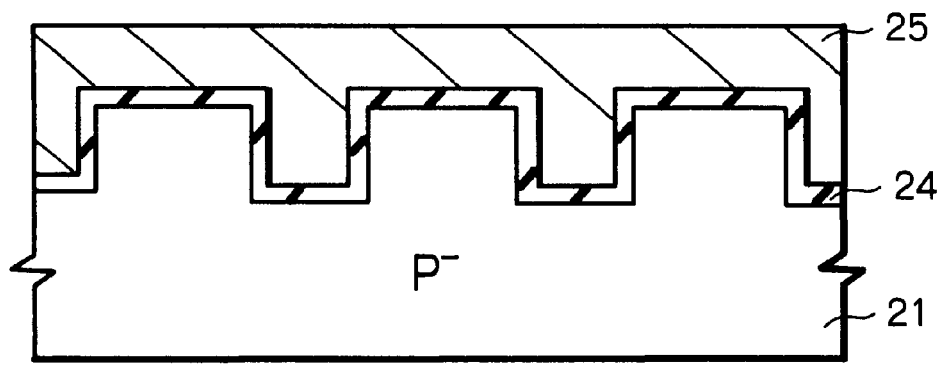

Next, referring to FIGS. 22A and 22B, a polycrystalline silicon layer 25 including phosphorus is deposited by a CVD process on the entire surface.

Figure 23A:
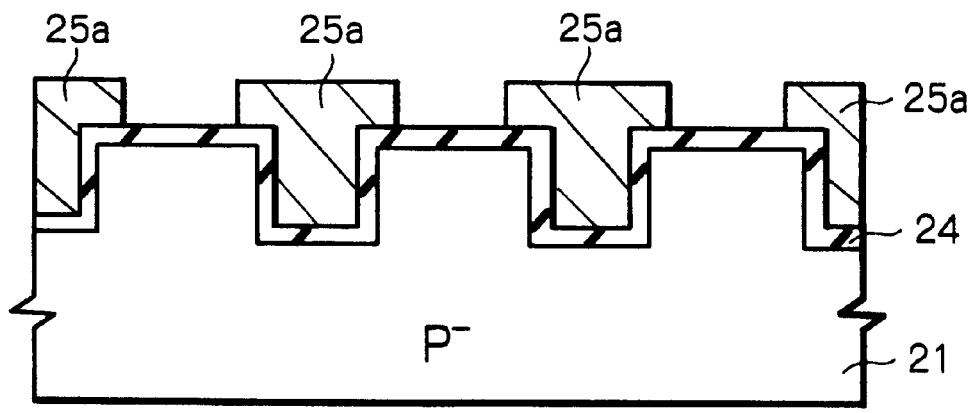
Figure 23B:
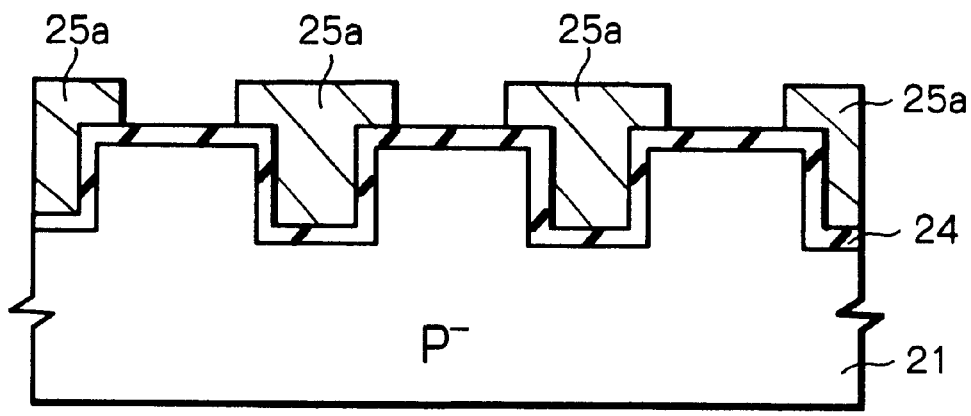

Next, referring to FIGS. 23A and 23B, the polycrystalline silicon layer 25 is patterned by a photolithography and etching process, so that polycrystalline silicon layers 25a of a rectangular shape are formed.

Figure 24A:
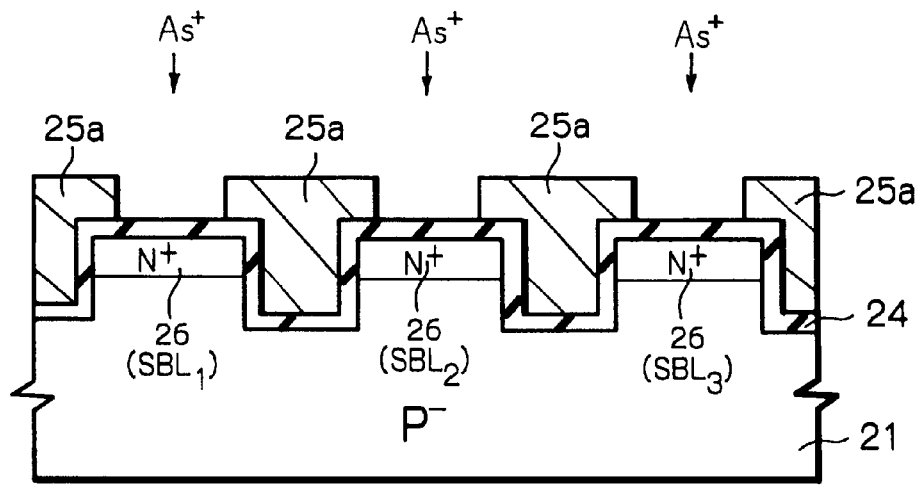
Figure 24B:
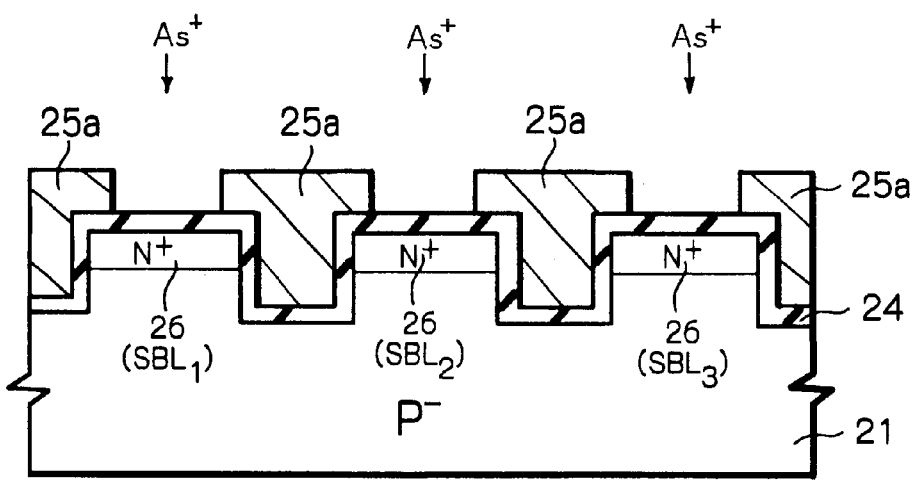

Next, referring to FIGS. 24A and 24B, about $1 \times 10^{15}$ to $5 \times 10^{15}$ arsenic ions/cm² are implanted at an energy of about 50 keV into the silicon substrate 21 by using the polycrystalline silicon layers 25a as a mask, and an annealing operation is performed thereupon. Thus, N⁺-type impurity diffusion layers 26, i.e., the sub bit lines $SBL_1$, $SBL_2$ and $SBL_3$ of FIG. 4 are formed.

Figure 25A:
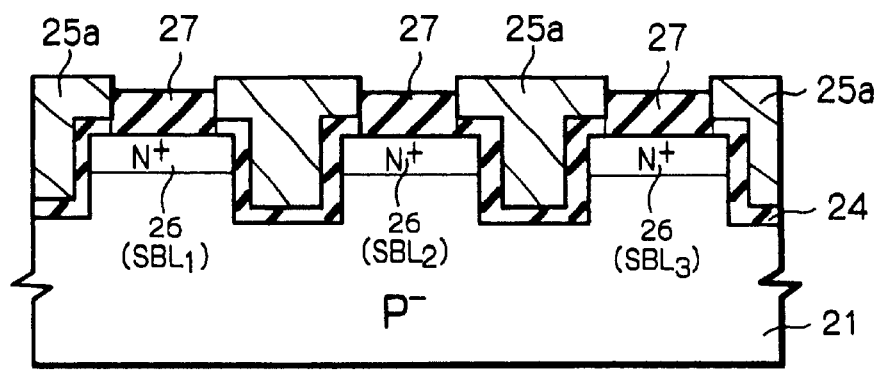
Figure 25B:
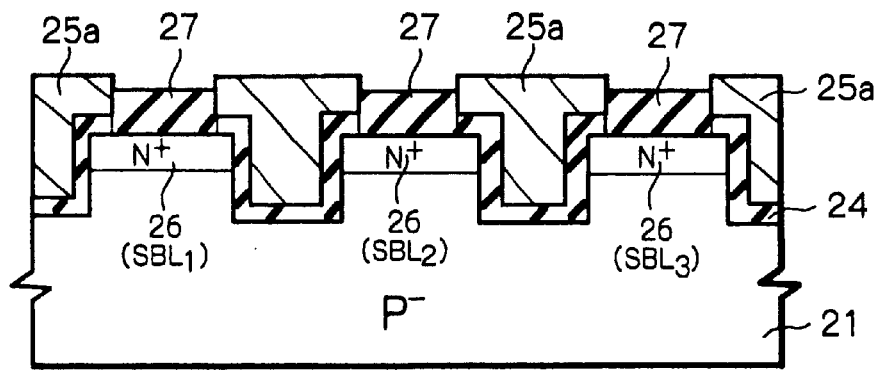

Next, referring to FIGS. 25A and 25B, silicon oxide layers 27 are formed between the polycrystalline silicon layers 25a. That is, a silicon oxide layer is deposited on the entire surface by a CVD process, and a CMP operation is performed upon the silicon oxide layer. As a result, the silicon oxide layers 27 are left only on the N⁺-type impurity diffusion layers 26.

Figure 26A:
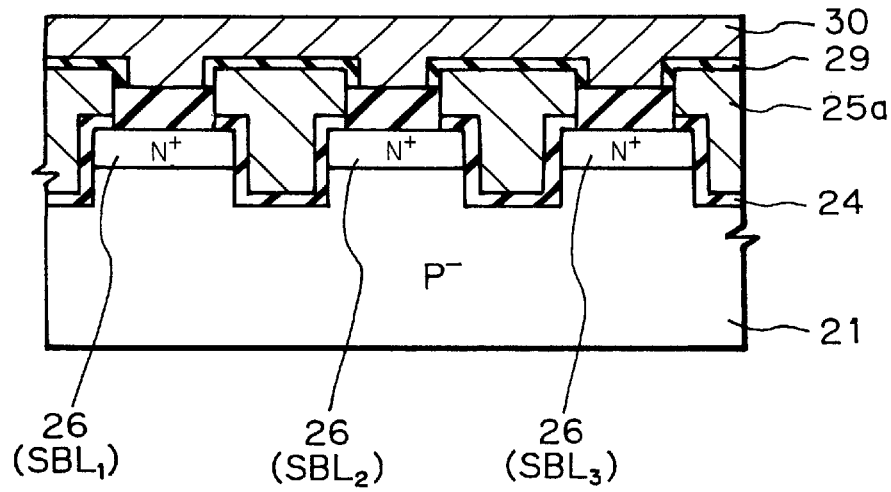
Figure 26B:
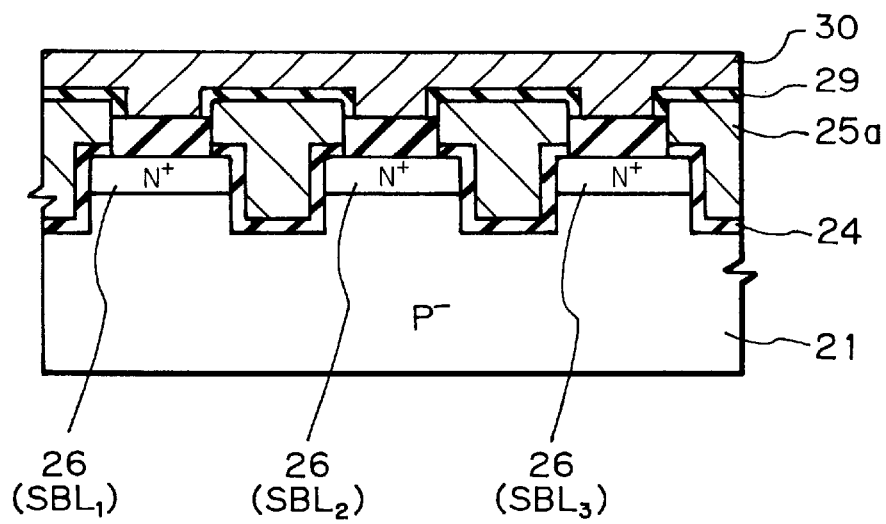

Next, referring to FIGS. 26A and 26B, a silicon oxide layer 29 is formed on the polycrystalline silicon layers 25a, and a polycrystalline silicon layer 10 including phosphorus is deposited on the entire surface by a CVD process.

Figure 27A:
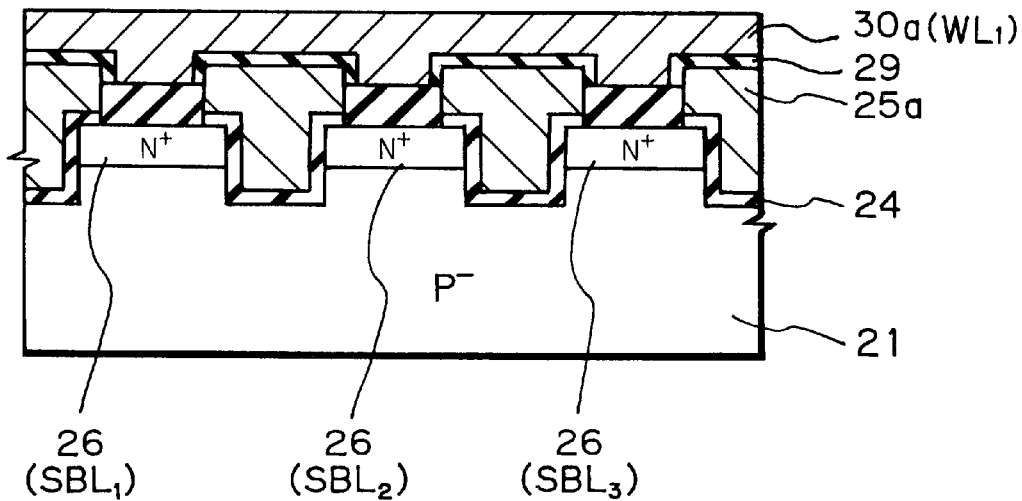
Figure 27B:
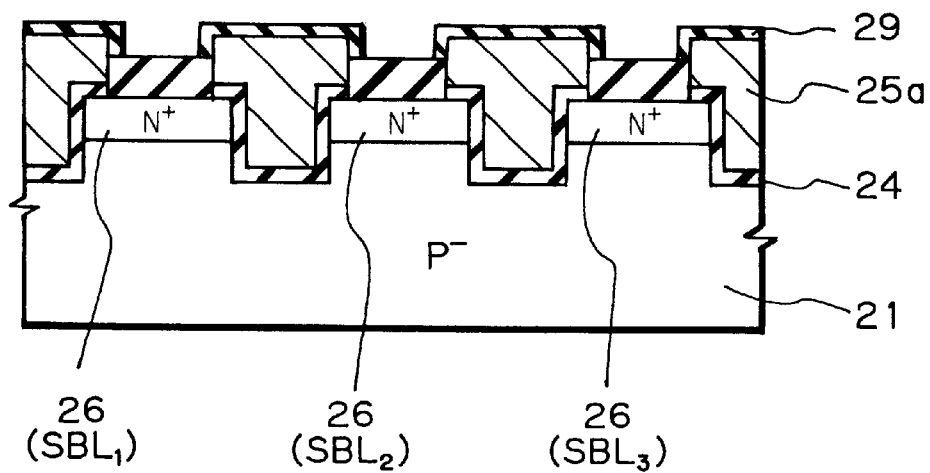

Next, referring to FIGS. 27A and 27B, the polycrystalline silicon layer 30 is patterned by a photolithography and dry etching process. As a result, patterned polycrystalline silicon layers 30a, i.e., the word lines $WL_1$ and $WL_2$ of FIG. 4 are obtained.

Figure 28A:
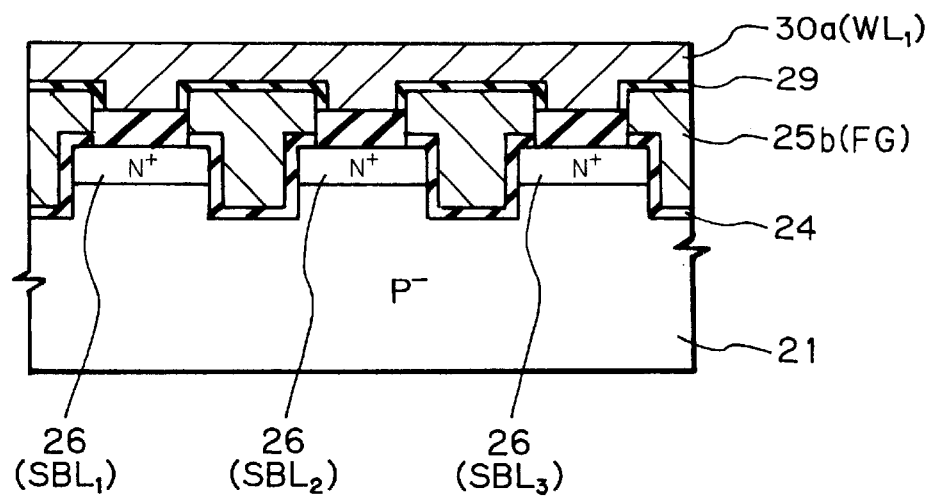
Figure 28B:
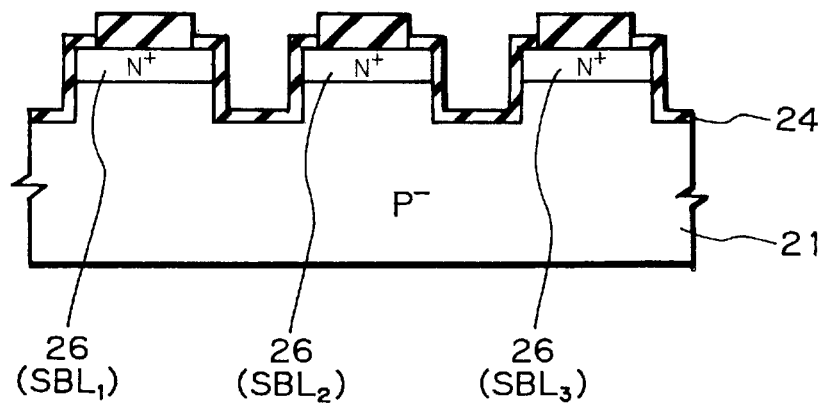

Next, referring to FIGS. 28A and 28B, the polycrystalline silicon layers 25a of a rectangular shape are further patterned by a photolithography and etching process using the word lines $WL_1$, $WL_2$, . . . as a mask, so that patterned polycrystalline silicon layers 25b, i.e., the floating gate electrodes FG of FIG. 4 are formed.

Figure 29A:
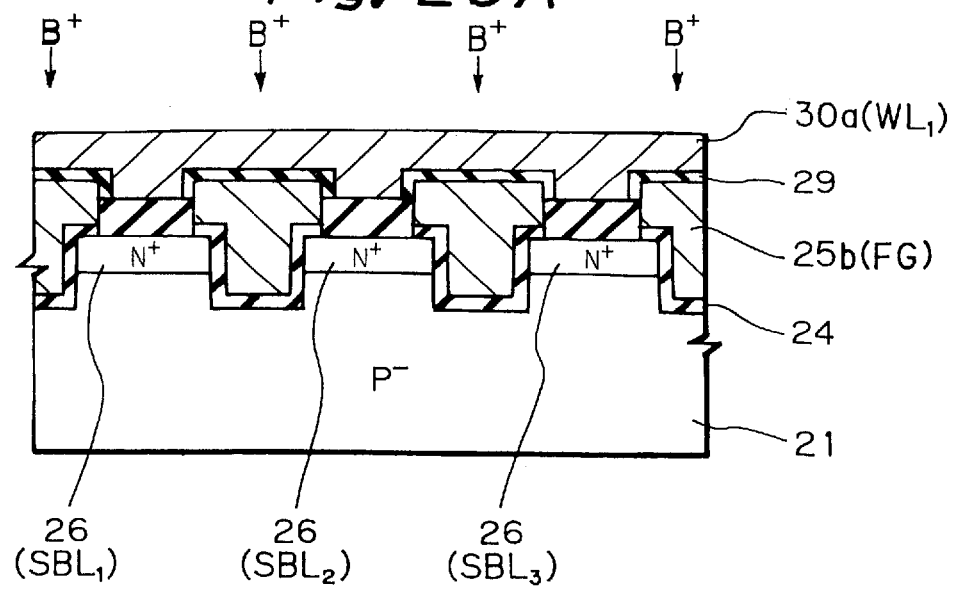
Figure 29B:
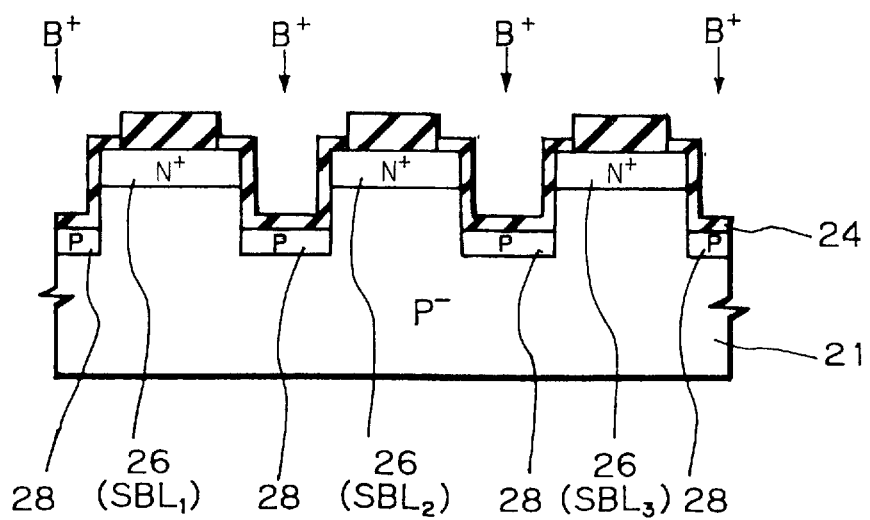

Next, referring Lo FIGS. 29A and 29B, about $1 \times 10^{13}$ boron ions/cm² are implanted at an energy of about 30 keV by using the polycrystalline silicon layers 25a (FG) and the silicon oxide layers 27 as a mask. Thereafter, an annealing operation is carried out. As a result, P-type channel stopper layers 28, i.e., the channel stopper layers STP of FIG. 4 are formed.

Figure 30A:
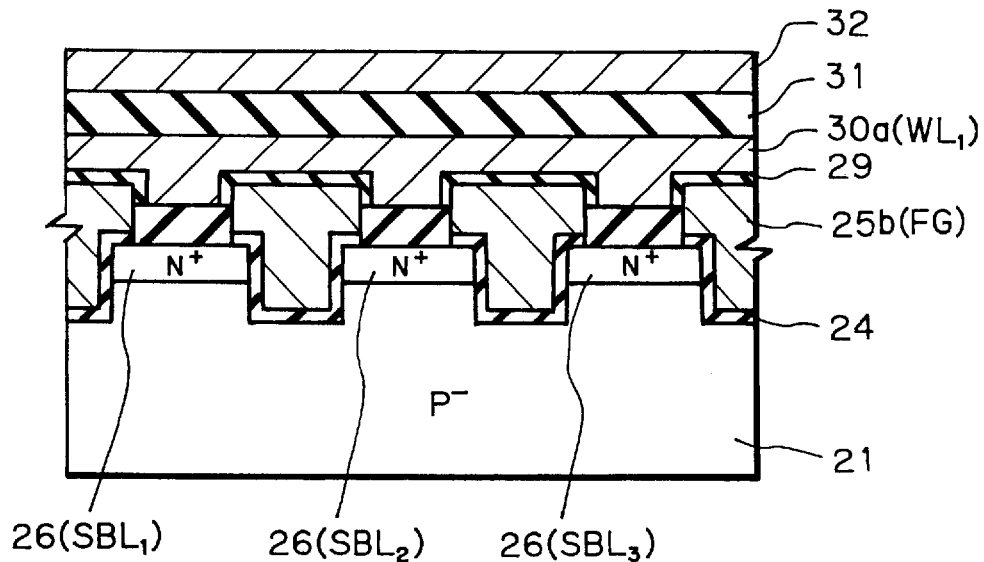
Figure 30B:
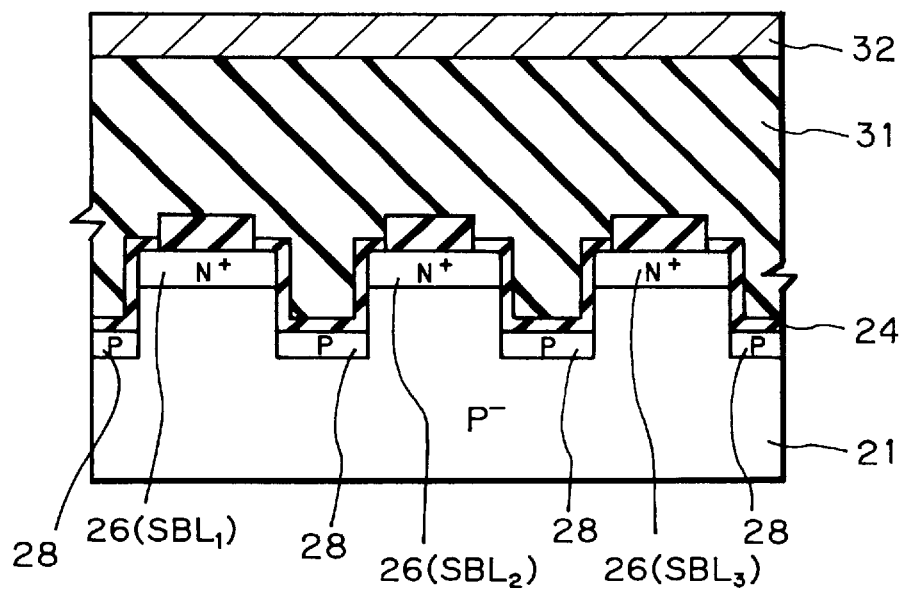

Next, referring to FIGS. 30A and 30B, a thick silicon oxide layer 31 is deposited by a CVD process, and then, a CMP operation is performed on the silicon oxide layer 31. Thus, the surface of the silicon oxide layer 31 is flattened. Then, an aluminum layer 32 is deposited on the silicon oxide layer 31 by a sputtering process.

Figure 31A:
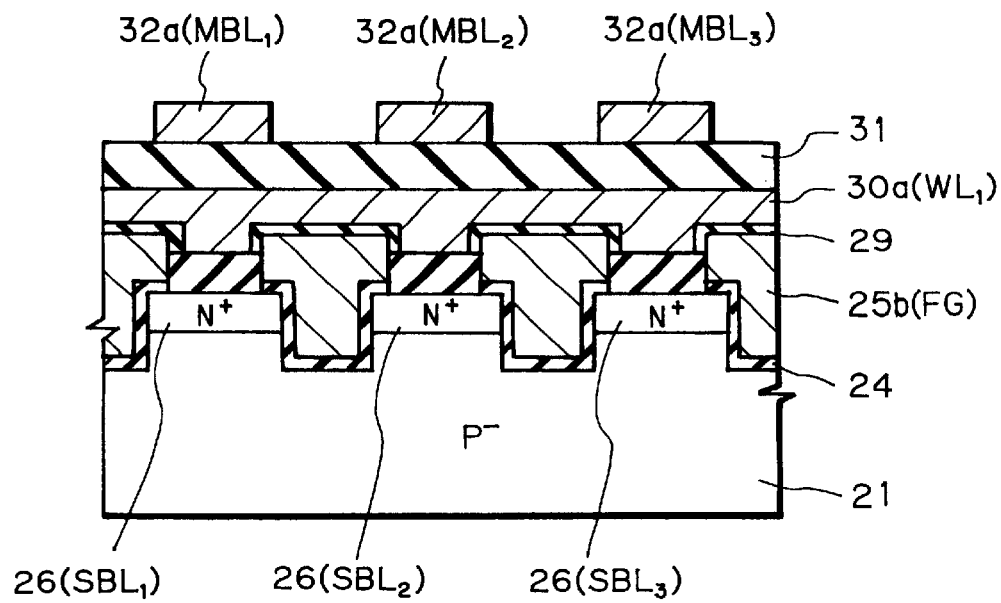
Figure 31B:
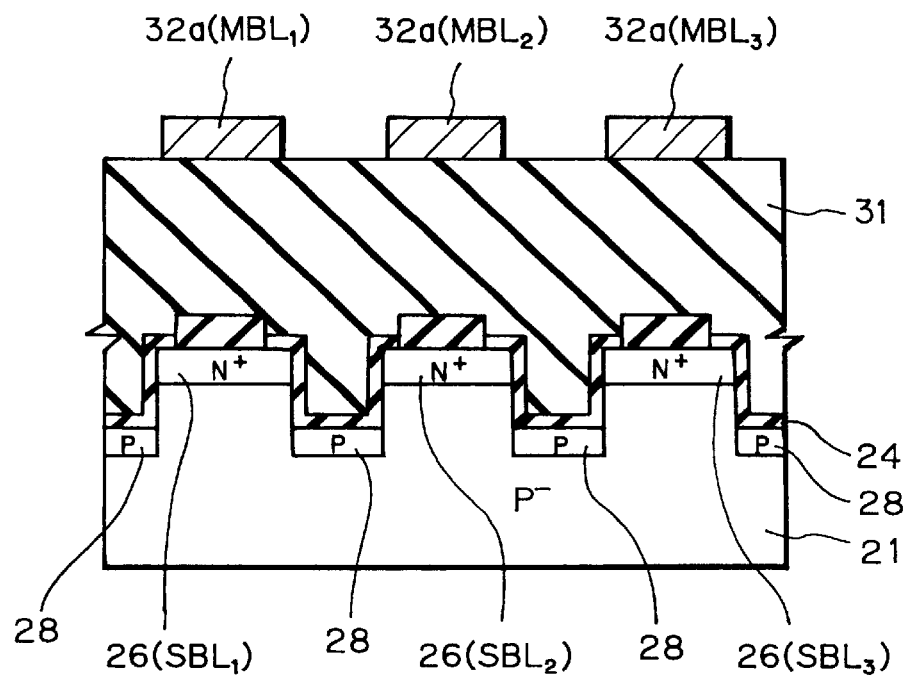

Finally, referring to FIGS. 31A and 31B, the aluminum layer 32 is patterned by a photolithography and etching process, so that patterned aluminum layers 32a, i.e., the main bit lines $MBL_1$, $MBL_2$ and $MBL_3$ of FIG. 4 are obtained.

Thus, the contactless virtual ground type nonvolatile semiconductor device of FIG. 4 is also completed.

Figure 32:
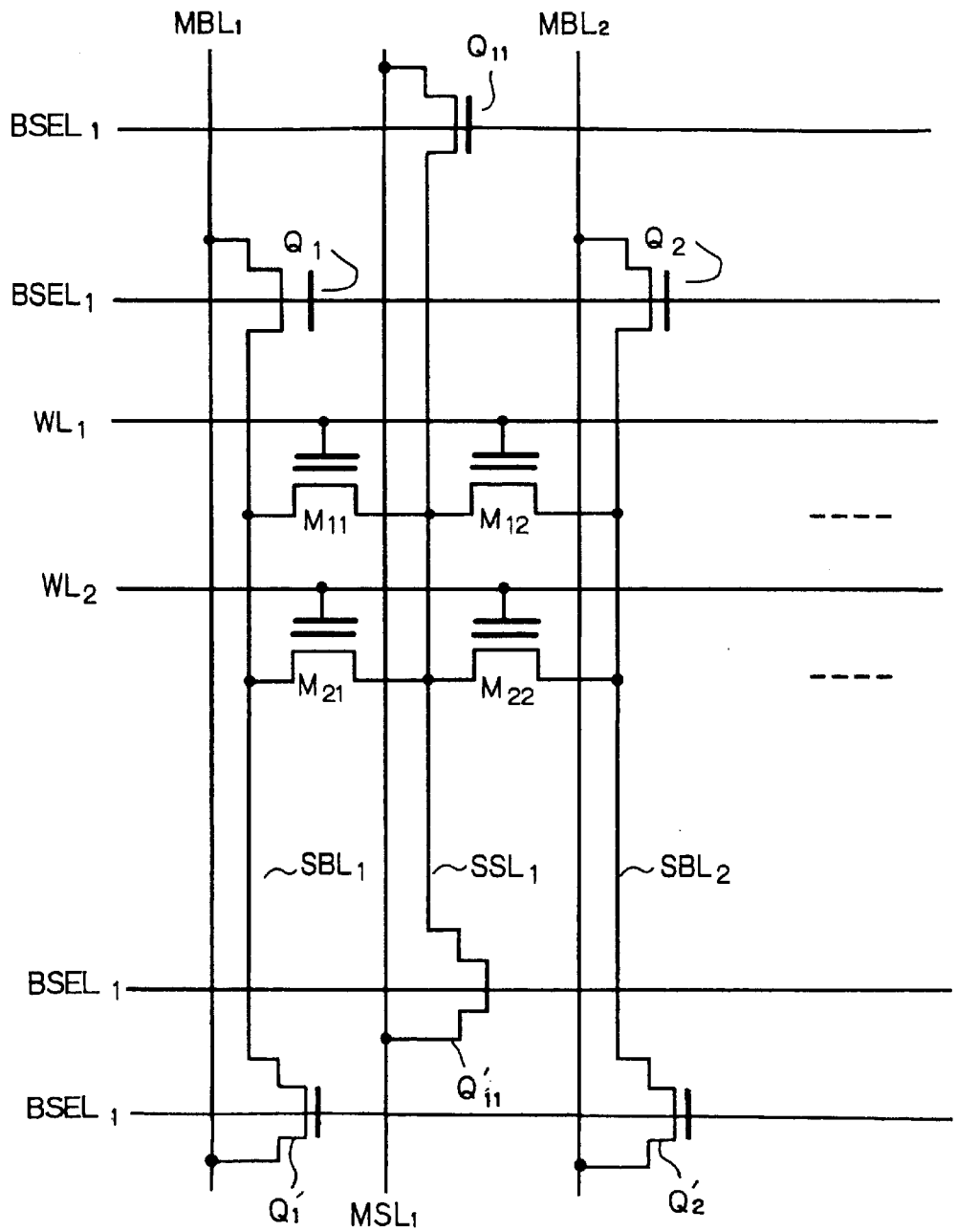
FIG. 32 is an equivalent circuit diagram illustrating another prior art contactless nonvolatile semiconductor memory device.

In FIG. 32, which is an equivalent circuit showing a prior art contactless AND type semiconductor memory device (see: JP-A-6-283721), main bit lines $MBL_1$, $MBL_2$, . . . are arranged along with sub bit lines $SBL_1$, $SBL_2$, . . . . Also, main source lines $MSL_1$, . . . are arranged along sub source lines $SSL_1$, . . . . For example, the main source line $MSL_1$ is arranged between the main bit lines $MBL_1$ and $MBL_2$, and the sub source line $SSL_1$ is arranged between the sub bit lines $SBL_1$ and $SBL_2$. Also, each of floating gate type nonvolatile memory cells $M_{11}$, $M_{12}$, . . . , $M_{21}$, $M_{22}$, . . . is connected to one of the word lines $WL_1$, $WL_2$, . . . , one of the sub bit lines $SBL_1$, $SBL_2$, . . . and one of the sub source lines $SSL_1$, $SSL_2$, . . . . The sub source lines $SSL_1$, . . . are connected to the main source lines $MSL_1$, . . . , respectively, via switching transistors $Q_{11}$, $Q_{11}'$ . . . turned ON and OFF by the block selection signal $BSEL_1$.

Figure 33:
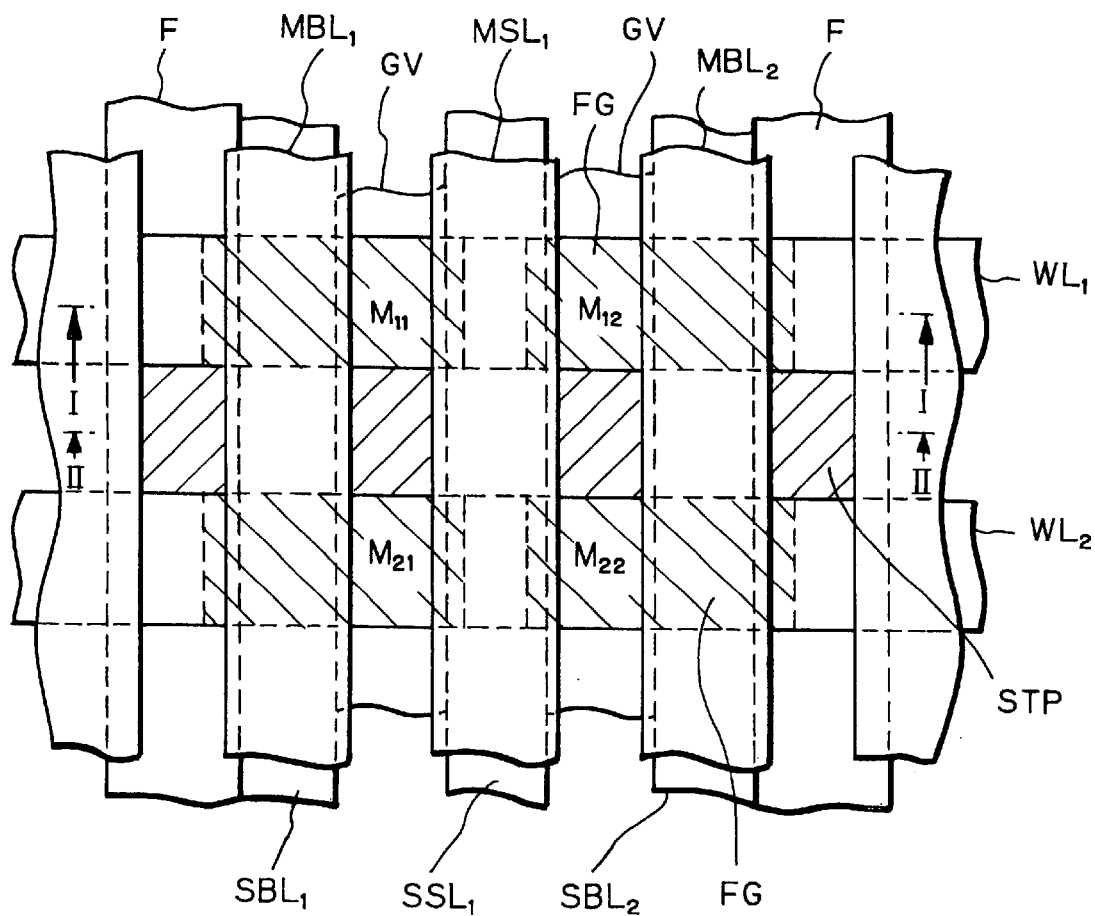
FIG. 33 is a plan view illustrating a second embodiment of the contactless nonvolatile semiconductor memory device according to the present invention.

In FIG. 33, which is a plan view illustrating a second embodiment of the present invention applied to the contactless AND type nonvolatile semiconductor memory device of FIG. 32, grooves GV are provided between the sub bit line $SBL_1$ and the sub source line $SSL_1$ and between the sub source line $SSL_1$ and the sub bit line $SBL_2$. As a result, a distance between the sub bit line such as $SBL_1$ and the sub source line $SSL_1$ is increased substantially, and thus, leakage currents therebetween can be decreased, even if an erase voltage is increased. In addition, since insulating layers (not shown) are formed completely on the sub bit lines $SBL_1$, $SBL_2$, . . . and the sub source lines $SSL_1$, . . . , when patterning floating gate electrodes FG by a dry etching process, the sub bit lines $SBL_1$, $SBL_2$, . . . and the sub source lines $SSL_1$, . . . are hardly etched.

In FIG. 33, note that references $WL_1$, $WL_2$, . . . designate word lines, and STP designates a channel stopper, and F designates a field silicon oxide layer for isolating every two columns from each other.

Figure 34A:
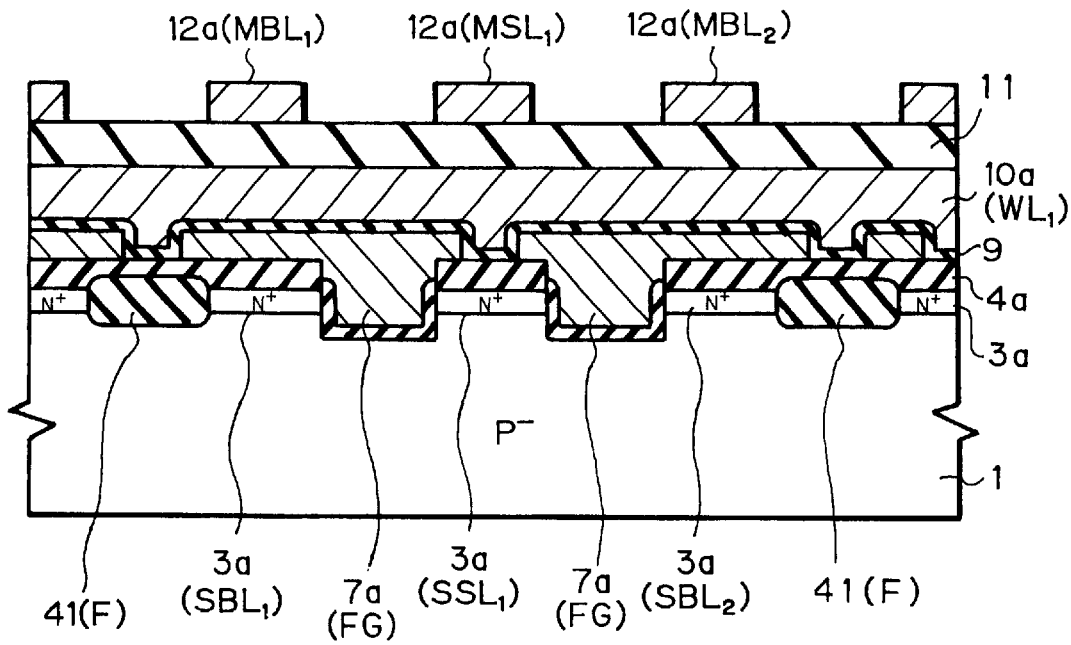
FIGS. 34A and 34B are cross-sectional views taken along the lines I—I and II—II, respectively, of FIG. 33.
Figure 34B:
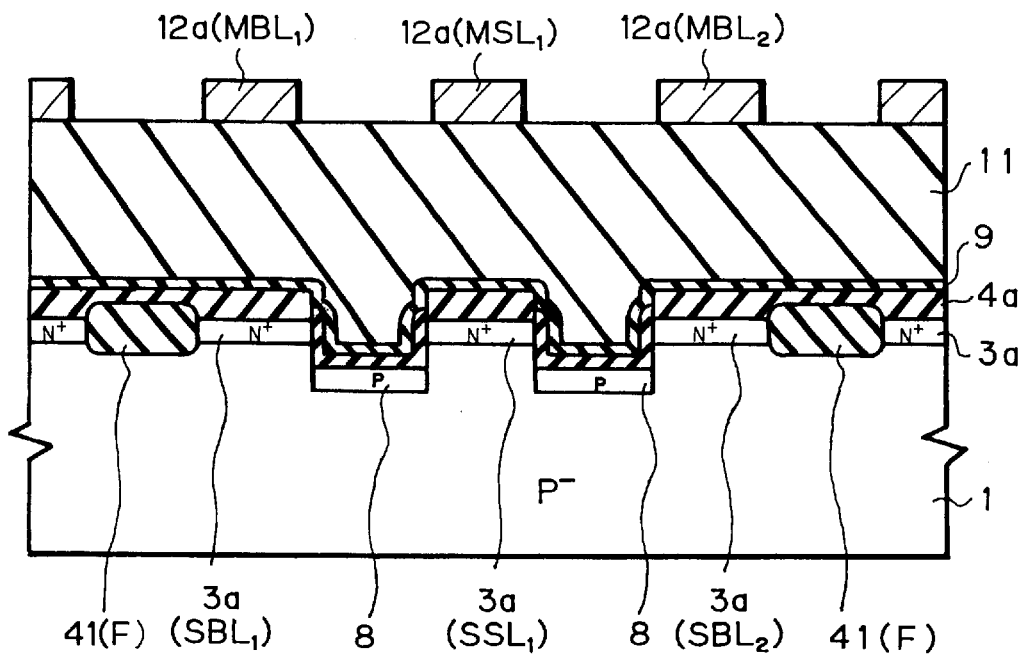

The device of FIG. 33 is explained next in detail with reference to FIGS. 34A and 34B which are cross-sectional views taken along the lines I—I and II—II, respectively, of FIG. 33. In FIGS. 34A and 34B, the elements of FIGS. 17A and 17B are denoted by the same references. That is, field silicon oxide layers 41 of a rectangular shape, i.e., the field silicon oxide layers F are provided for every three N⁻-type impurity layers 3a of a rectangular shape. Also, the polycrystalline silicon layers 7a (the floating gate electrodes FG) are wider than those of FIG. 17A, since no memory cell exists on the field silicon oxide layers 41 (F).

Figure 35:
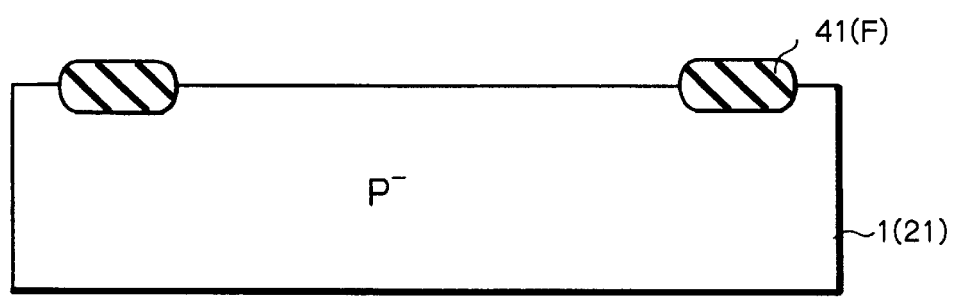
FIG. 35 is a cross-sectional view showing a method for manufacturing the device of FIG. 33.

The method of manufacturing the device of FIG. 33 is the same as that of manufacturing the device of FIG. 4 except for the field silicon oxide layers 41. For example, in the first, manufacturing method as illustrated in FIGS. 5A, 5B through 17A and 17B, and in the second manufacturing method as illustrated in FIGS. 18A and 18B through 31A and 31B, field silicon oxide layers 41 are first grown on the silicon substrate 1 by a local oxidation of silicon (LOCOS) process, as illustrated in FIG. 35.

Figure 36:
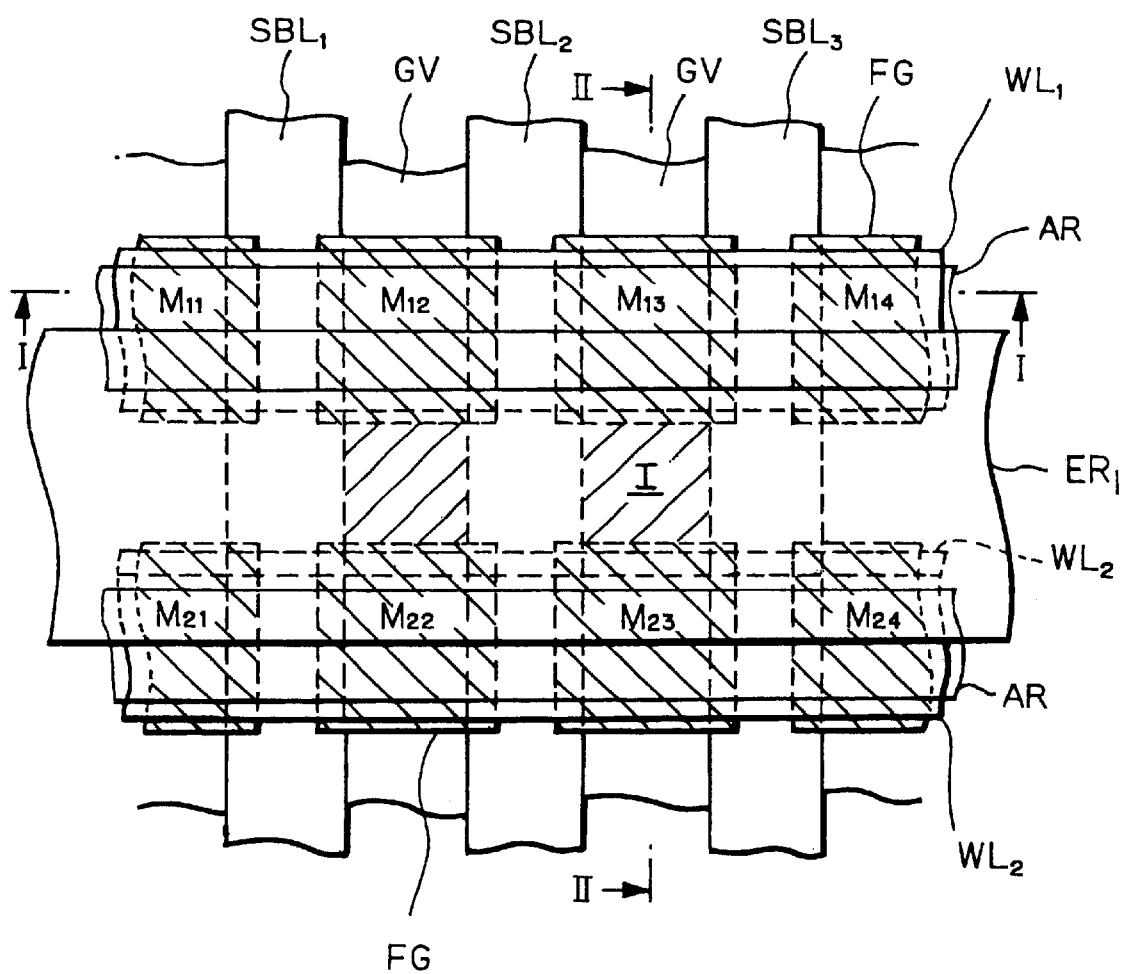
FIG. 36 is a plan view illustrating a third embodiment of the contactless nonvolatile semiconductor memory device according to the present invention.

In FIG. 36, which is a plan view illustrating a third embodiment of the present invention, a contactless virtual ground type flash nonvolatile semiconductor device is illustrated. That is, erase gate electrodes $ER_1$, . . . are added to the elements of FIG. 4. Also, element isolation layers I are provided instead of the channel stoppers STP of FIG. 4. Even in FIG. 36, the grooves GV are provided between the sub bit lines $SBL_1$, $SBL_2$, $SBL_3$, . . . which are also formed by buried impurity layers. As a result, a distance between the sub bit lines $SBL_1$, $SBL_2$, $SBL_3$, . . . is increased substantially, and thus, leakage currents therebetween can be decreased, even if an erase voltage is increased. Further, the channel length becomes larger than the distance between the sub bit lines $SBL_1$, $SBL_2$, $SBL_3$, . . . , which suppresses the short channel effect. In addition, when patterning floating gate electrodes FG by a dry etching process, the sub bit lines $SBL_1$, $SBL_2$, $SBL_3$, . . . are hardly etched.

In FIG. 36, note that references $WL_1$, $WL_2$, designate word lines. Also, main bit lines $MBL_1$, $MBL_2$, $MBL_3$, . . . which are not shown are provided along the sub bit lines $SBL_1$, $SBL_2$, $SBL_3$, . . . . Further, AR desighates an active area where isolation insulating layers are not formed.

A method for manufacturing the contactless virtual ground type flash nonvolatile semiconductor memory device of FIG. 36 is explained next with reference to FIGS. 37A, 37B, 38A, 38B, 39A, 39B, 40A, 40B, 41A, 41B, 42A, 42B, 43A, 43B, 44A, 44B, 45A, 45B, 46A, 46B, 47A, 47B, 48A, 48B, 49A, 49B, 50A, 50B, 51A, 51B, 52A, 52B, 53A and 53B. Note that FIGS. 37A through 53A are cross-sectional views taken along the line I—I of FIG. 36, and FIGS. 37B through 53B are cross-sectional views taken along the line II—II of FIG. 36.

Figure 37A:
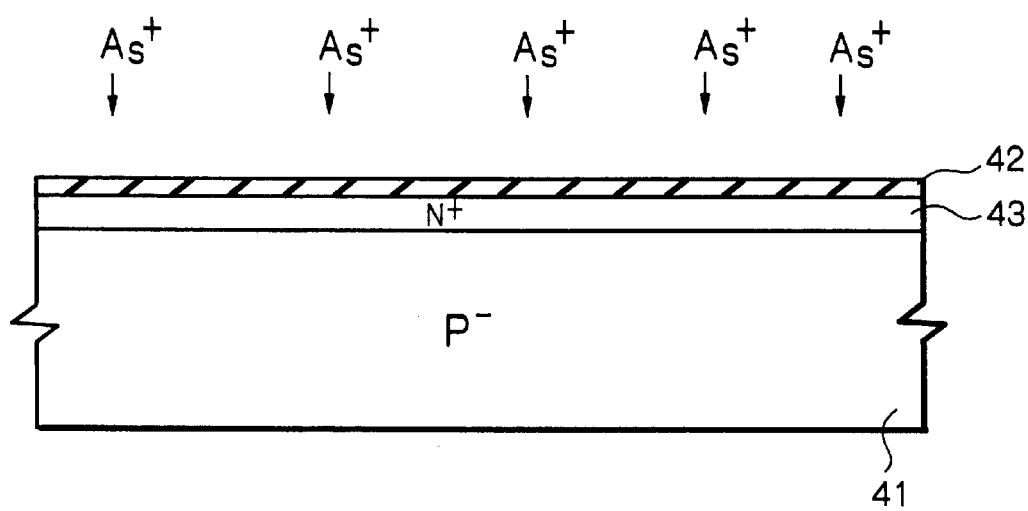
FIGS. 37A, 37B, 38A, 38B, 39A, 39B, 40A, 40B, 41A, 41B, 42A, 42B, 43A, 43B, 44A, 44B, 45A, 45B, 46A, 46B, 47A, 47B, 48A, 48B, 49A, 49B, 50A, 50B, 51A, 51B, 52A, 52B, 53A and 53B are cross-sectional views showing a method for manufacturing the device of FIG. 36.
Figure 37B:
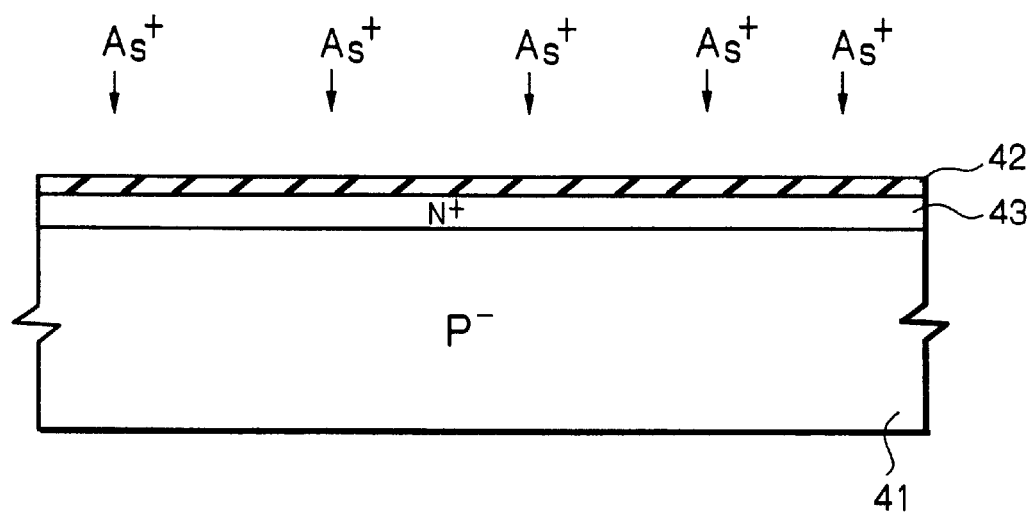

First, referring to FIGS. 37A and 37B, an about 1 to 20 nm thick silicon oxide layer 42 is formed on a P⁻-type silicon substrate 41 by using a thermal oxidation process or a CVD process. Then, about $1 \times 10^{15}$ to $7 \times 10^{15}$ arsenic ions/cm² are implanted at an energy of about 50 keV into the silicon substrate 41, and an annealing operation is performed thereupon. Thus, an N⁺-type impurity diffusion layer 43 is formed.

Figure 38A:
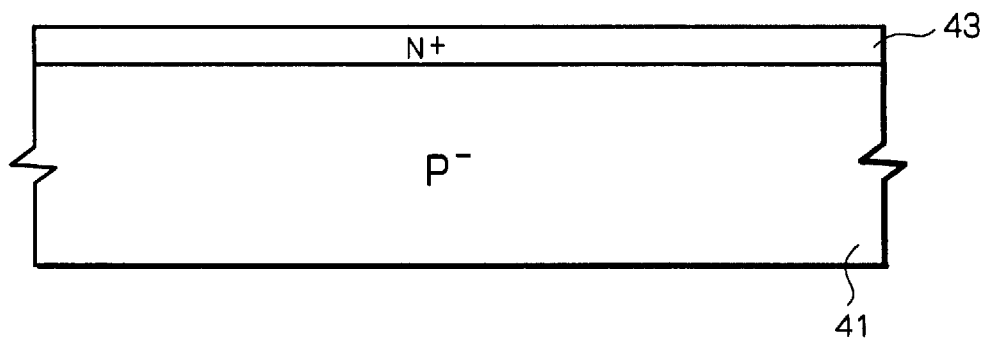
Figure 38B:
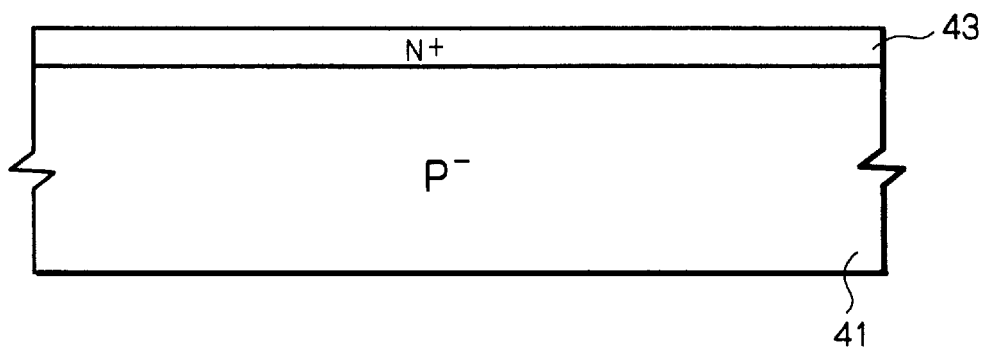

Next, referring to FIGS. 38A and 38B, the silicon oxide layer 42 is removed.

Figure 39A:
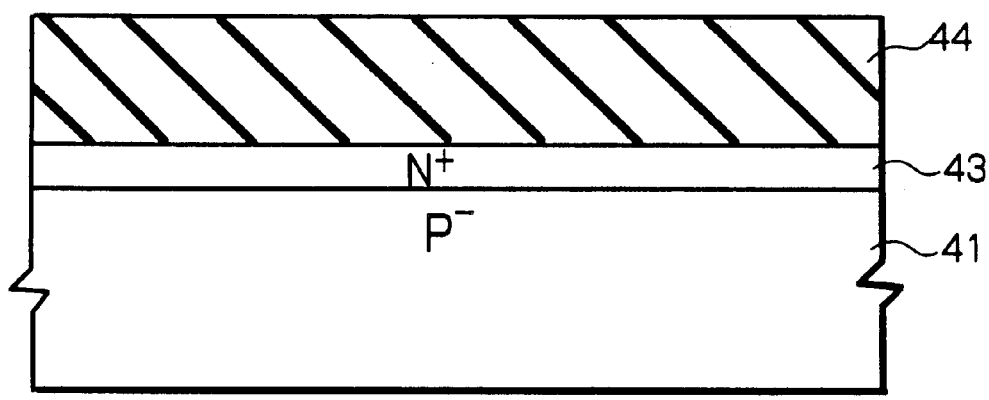
Figure 39B:
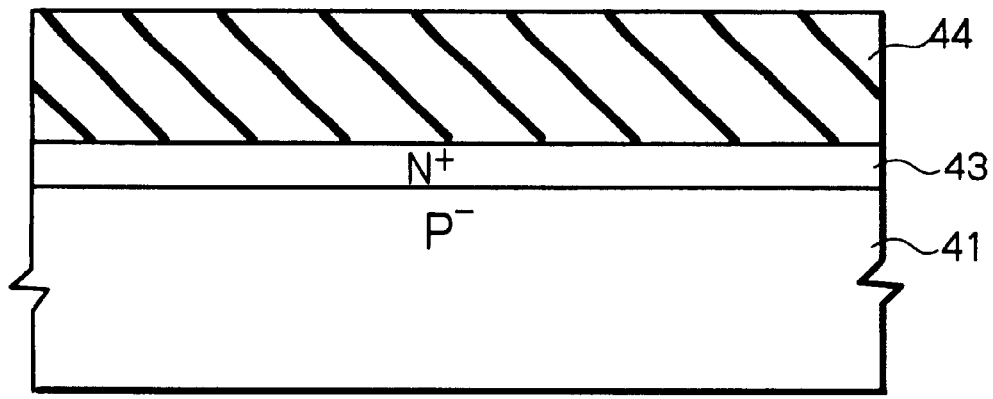

Next, referring to FIGS. 39A and 39B, an about 200 to 500 nm thick silicon oxide layer 44 is deposited on the N⁺-type impurity diffusion layer 43.

Figure 40A:
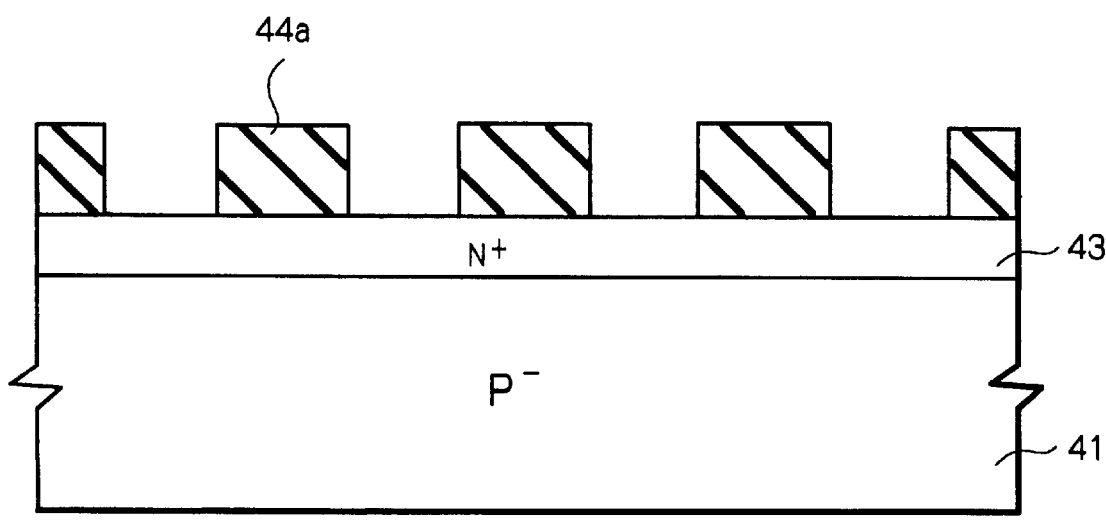
Figure 40B:
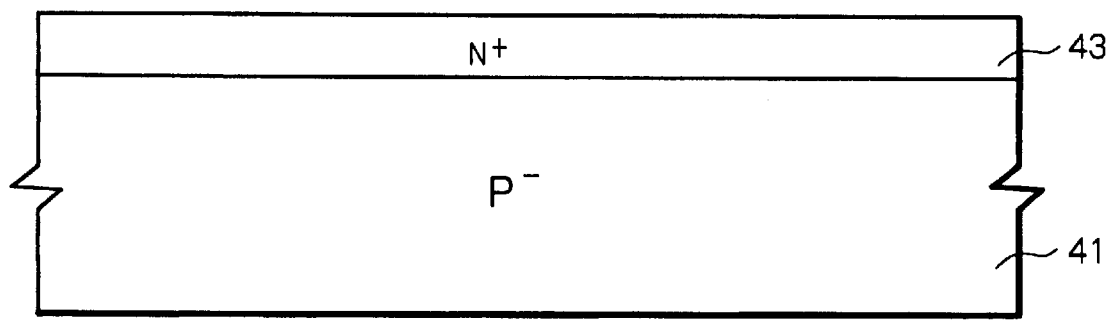

Next, referring to FIGS. 40A and 40B, the silicon oxide layer 44 is patterned by a photolithography and etching process. As a result, patterned silicon oxide layers 44a of a rectangular shape are obtained. In this case, in FIG. 40B, the N⁺-type impurity diffusion layer 43 is exposed.

Figure 41A:
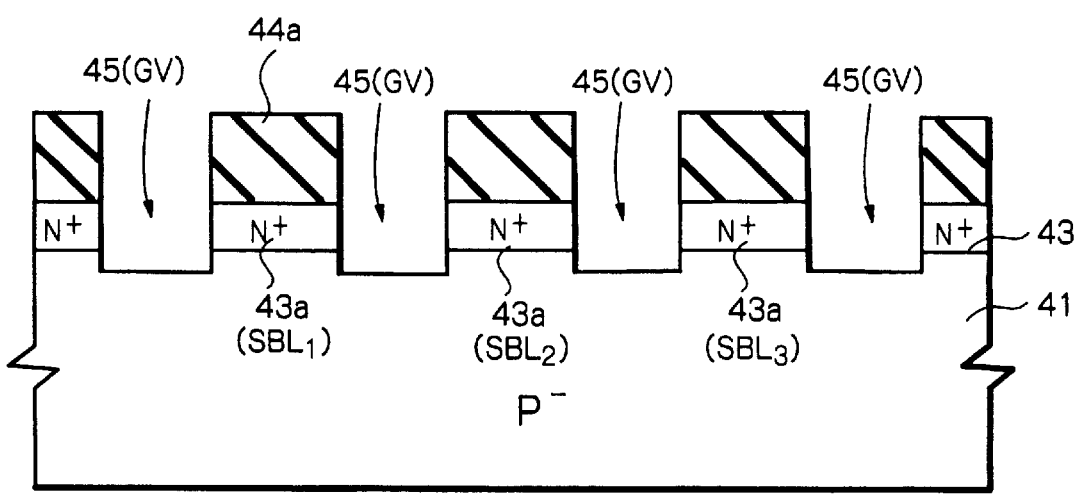
Figure 41B:
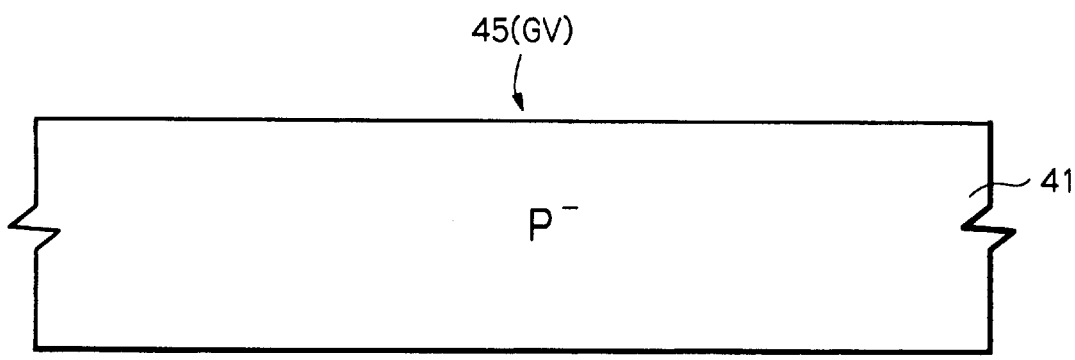

Next, referring to FIGS. 41A and 41B, the N⁺-type impurity diffusion layer 43 and the silicon substrate 41 are etched by a dry etching process using the silicon oxide layers 44a as a mask. As a result, patterned N⁻-type impurity diffusion layers 43a are in self-alignment with patterned silicon oxide layers 44a. In this case, the N⁻-type impurity diffusion layers 43a are of a rectangular shape and form the sub bit lines $SBL_1$, $SBL_2$ and $SBL_3$ of FIG. 36. Also, as a result, grooves 45 of a rectangular shape, i.e., the grooves GV of FIG. 36 are formed in self-alignment with the silicon oxide layers 44a. In this case, in FIG. 41B, the thickness of the silicon substrate 41 is reduced. Then, the silicon oxide layers 44a are removed.

Figure 42A:
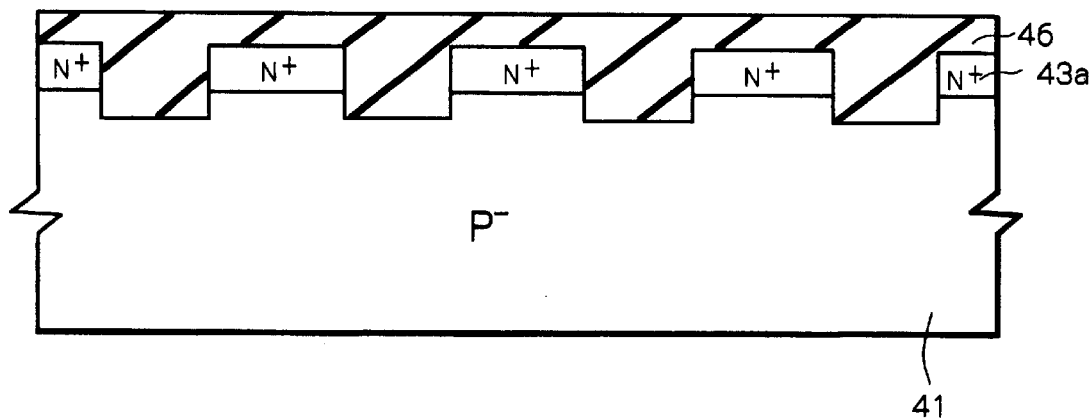
Figure 42B:
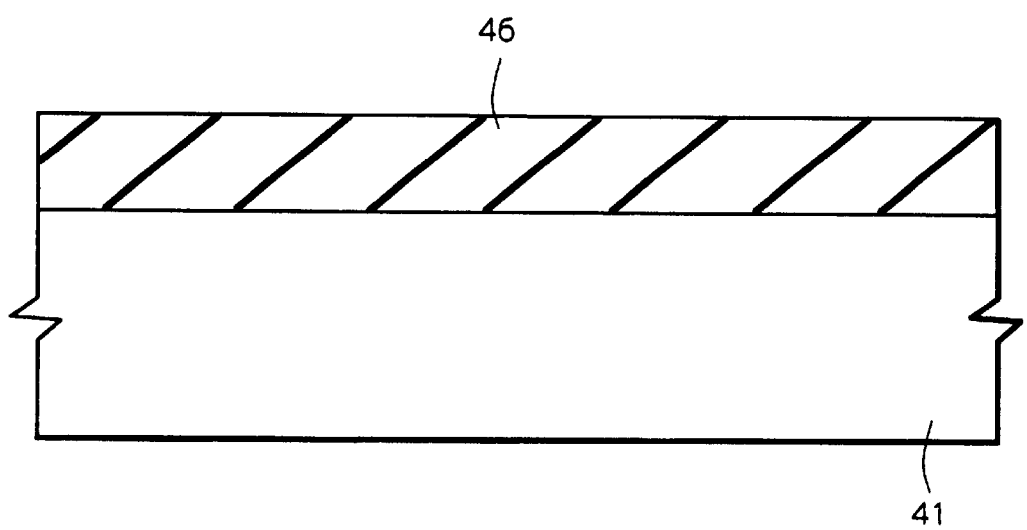

Next, referring to FIGS. 42A and 42B, a thick silicon oxide layer 46 is deposited on the entire surface by a CVD process.

Figure 43A:
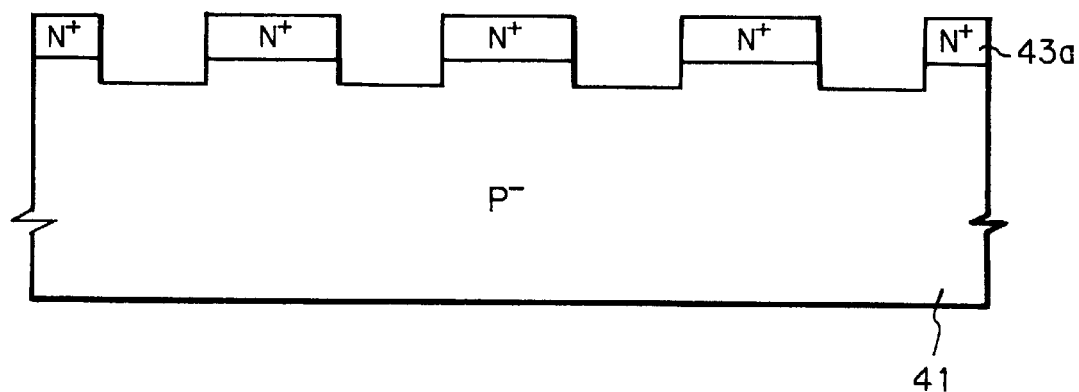
Figure 43B:
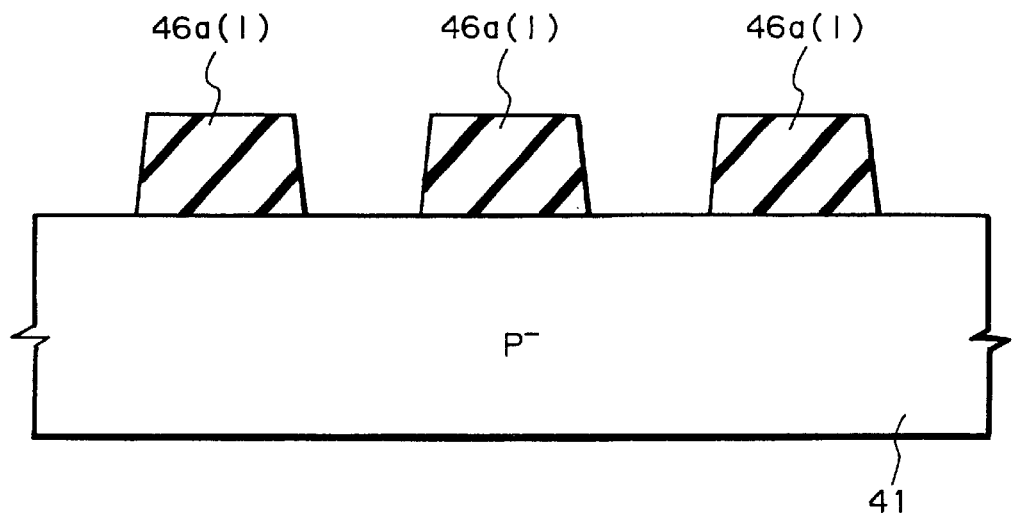

Next, referring to FIGS. 43A and 43B, the thick silicon oxide layer 46 is patterned by a photolithography and etching process, so that patterned silicon oxide layers 46a, i.e., the element isolation layers I of FIG. 36 are formed.

Figure 44A:
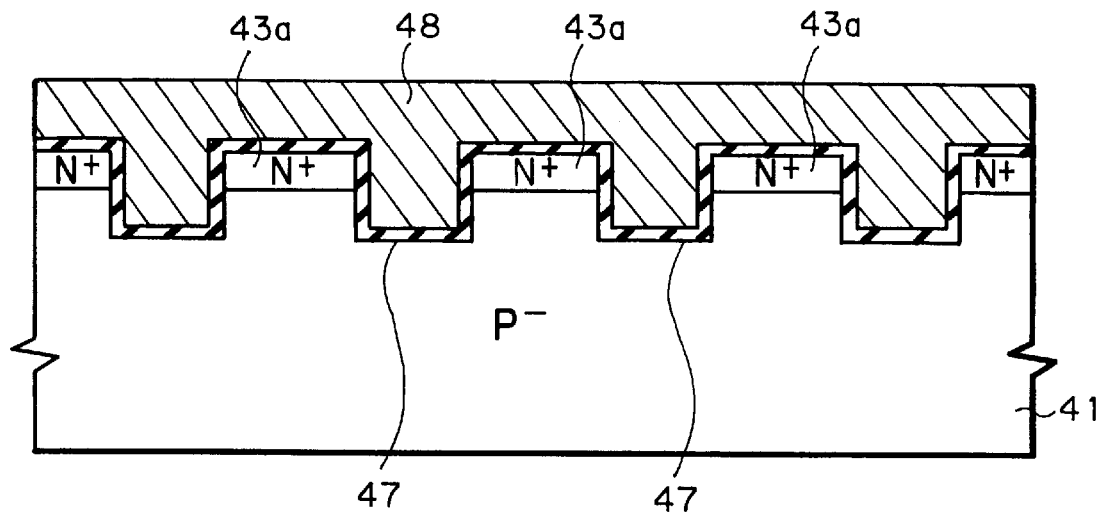
Figure 44B:
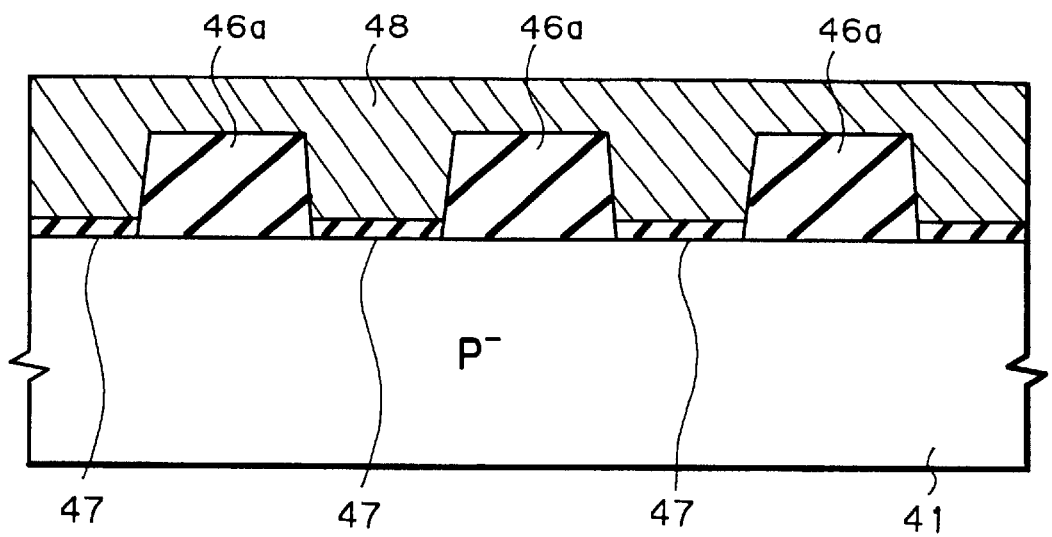

Next, referring to FIGS. 44A and 44B, a thermal oxidation operation is carried out, so that an about 7 to 10 nm thick gate silicon oxide layer 47 is formed. Then, a polycrystalline silicon layer 48 including phosphorus is deposited by a CVD process on the entire surface.

Figure 45A:
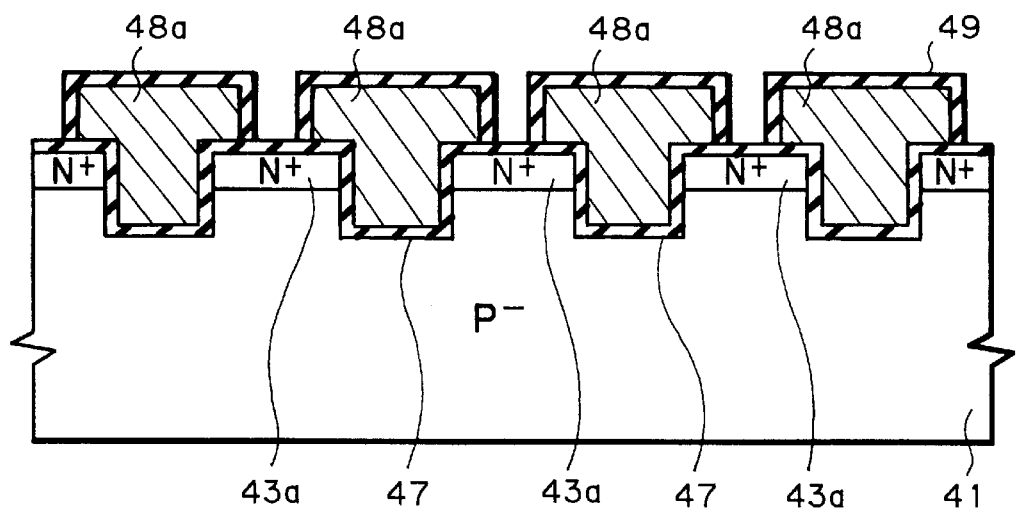
Figure 45B:
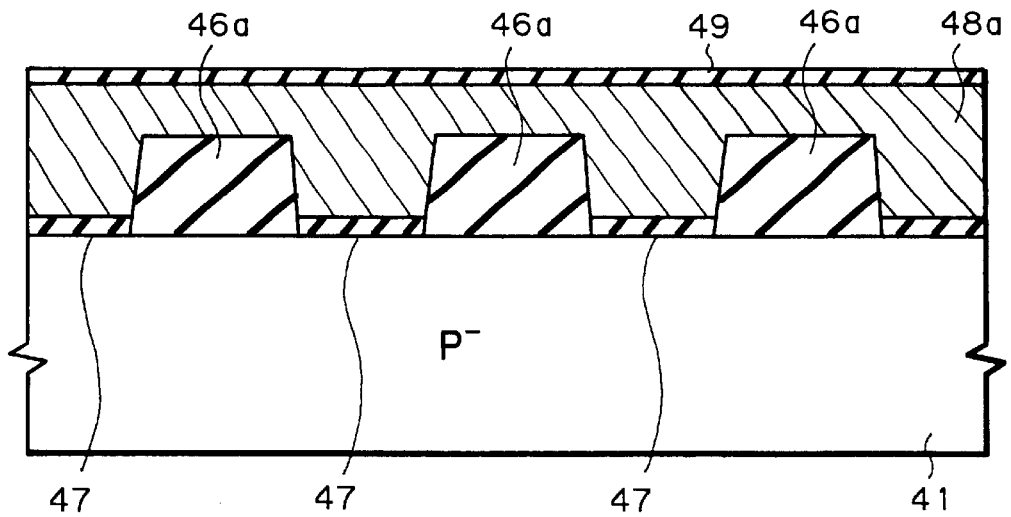

Next, referring to FIGS. 45A and 45B, the polycrystalline silicon layer 48 is patterned by a photolithography and etching process, so that polycrystalline silicon layers 48a of a rectangular shape are formed. Then, a gate insulating layer 49 made of ONO is formed on the entire surface.

Figure 46A:
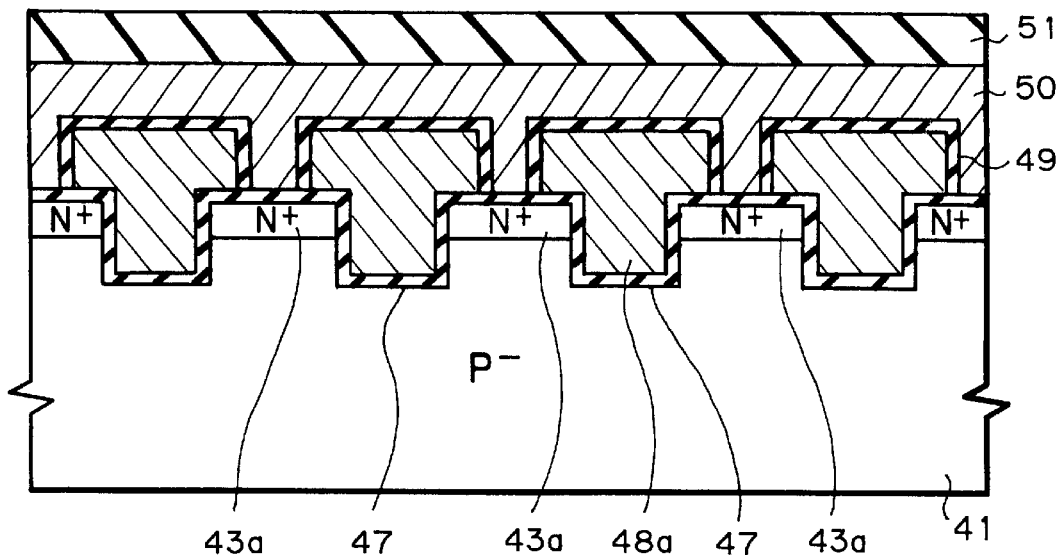
Figure 46B:
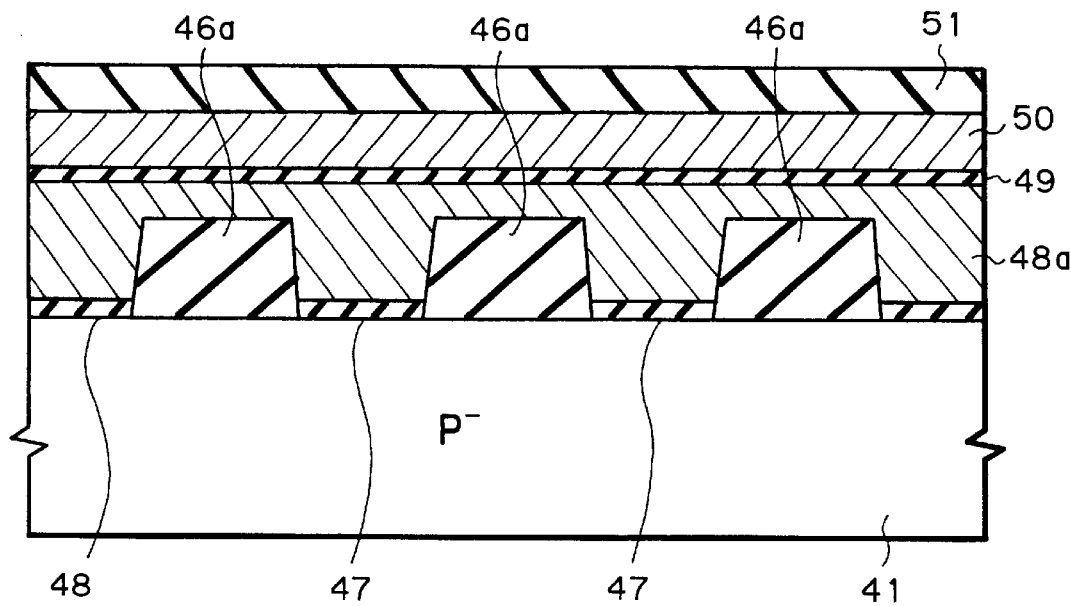

Next, referring to FIGS. 46A and 46B, a polycrystalline silicon layer 50 including phosphorus is deposited on the gate insulating layer 49 by a CVD process. Then, a thick silicon oxide layer 51 is deposited on the entire surface by a CVD process.

Figure 47A:
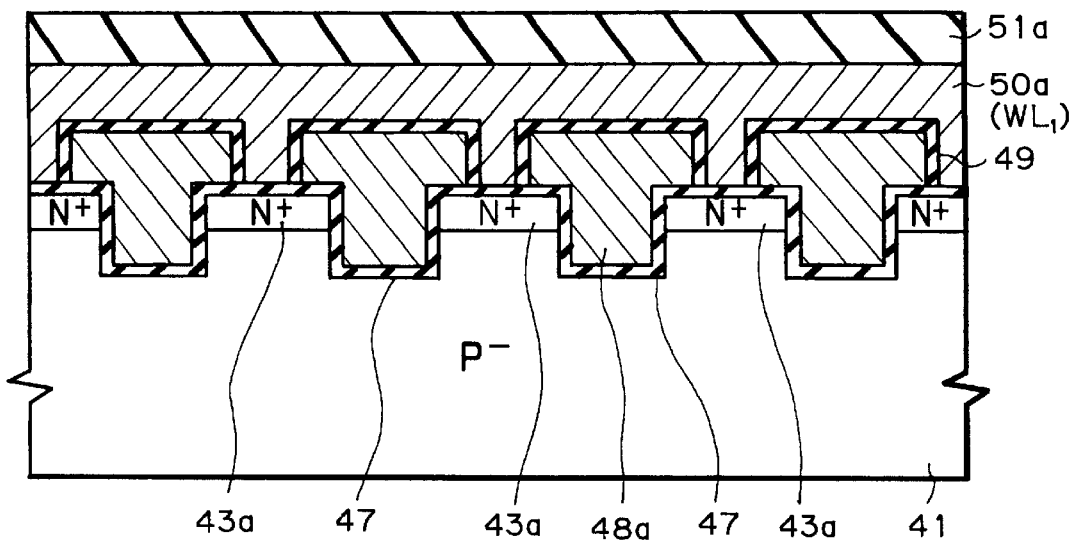
Figure 47B:
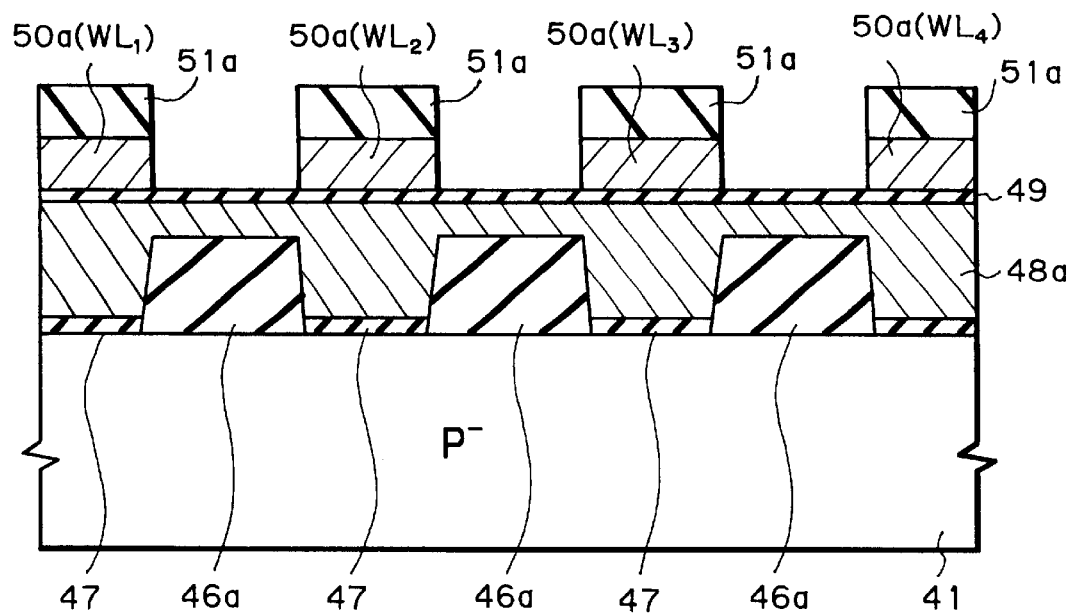

Next, referring to FIGS. 47A and 47B, the silicon oxide layer 51 is patterned by a photolithography and etching process, so that patterned silicon oxide layers 51a are obtained. Then, the polycrystalline silicon layer 50 is patterned by an etching process using the silicon oxide layers 51a as a mask. As a result, patterned polycrystalline silicon layers 50a, i.e., the word lines $WL_1$, $WL_2$, $WL_3$ and $WL_4$ of FIG. 36 are obtained.

Figure 48A:
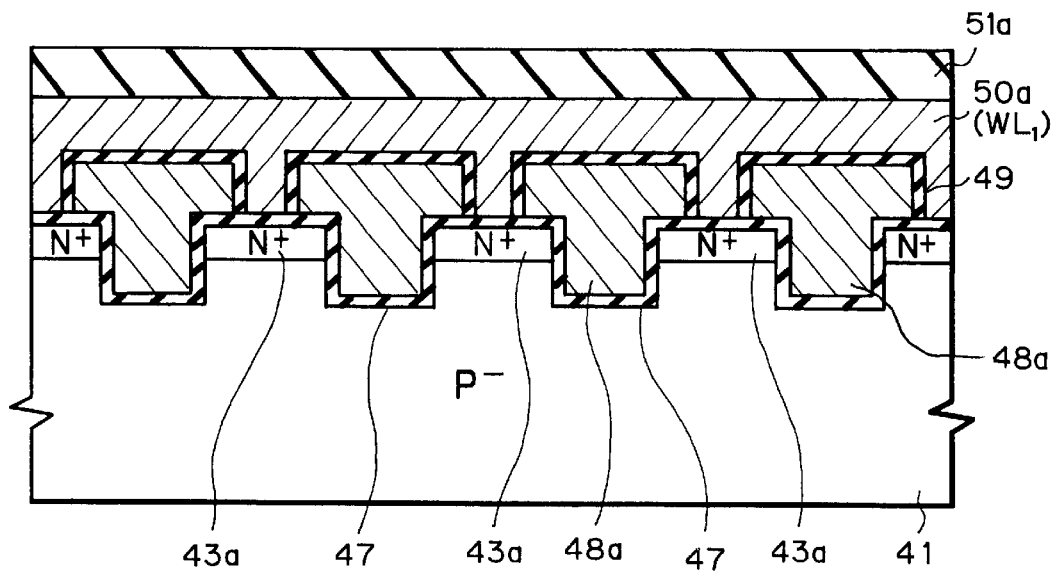
Figure 48B:
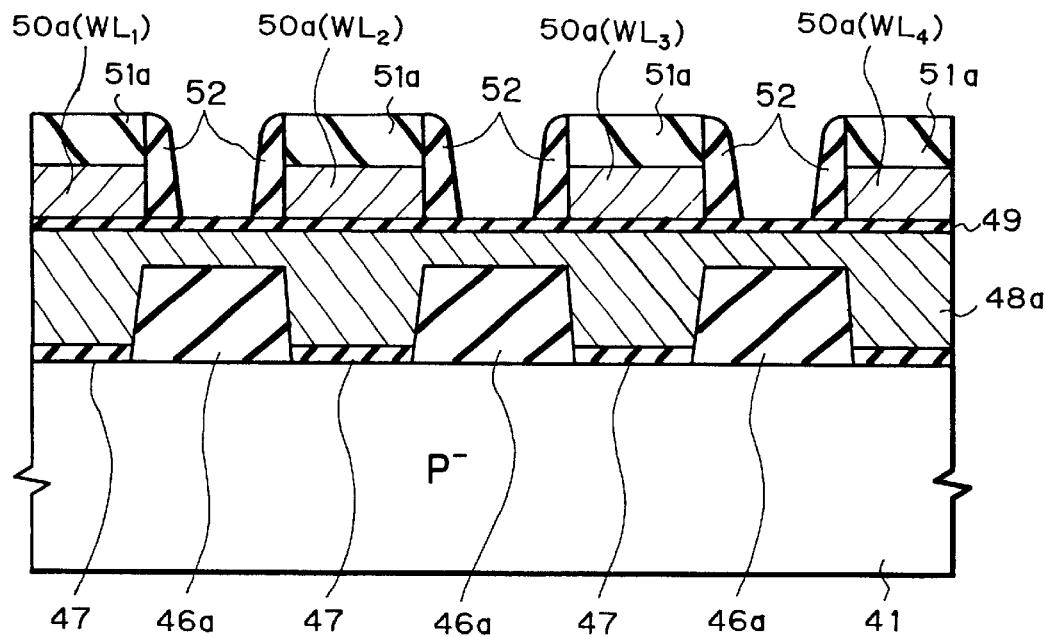

Next, referring to FIGS. 48A and 48B, a silicon oxide layer (not shown) is deposited on the entire surface, and the silicon oxide layer is etched back by an anisotropic (dry) etching process. As a result, sidewall silicon oxide layers 52 are formed on sidewalls of the silicon oxide layers 51a and the polycrystalline silicon layers 50a.

Figure 49A:
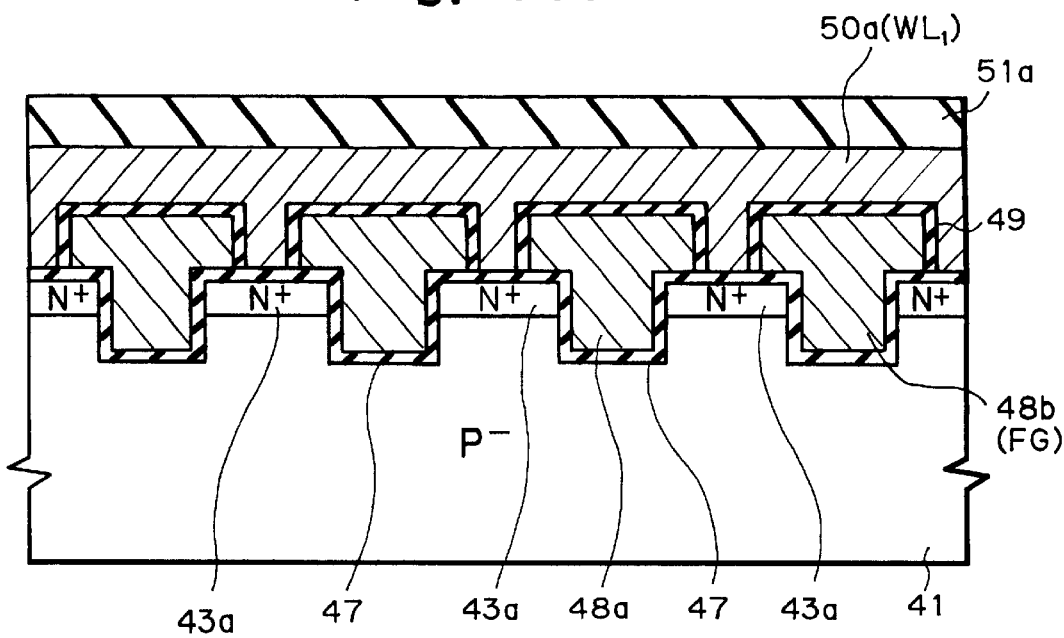
Figure 49B:
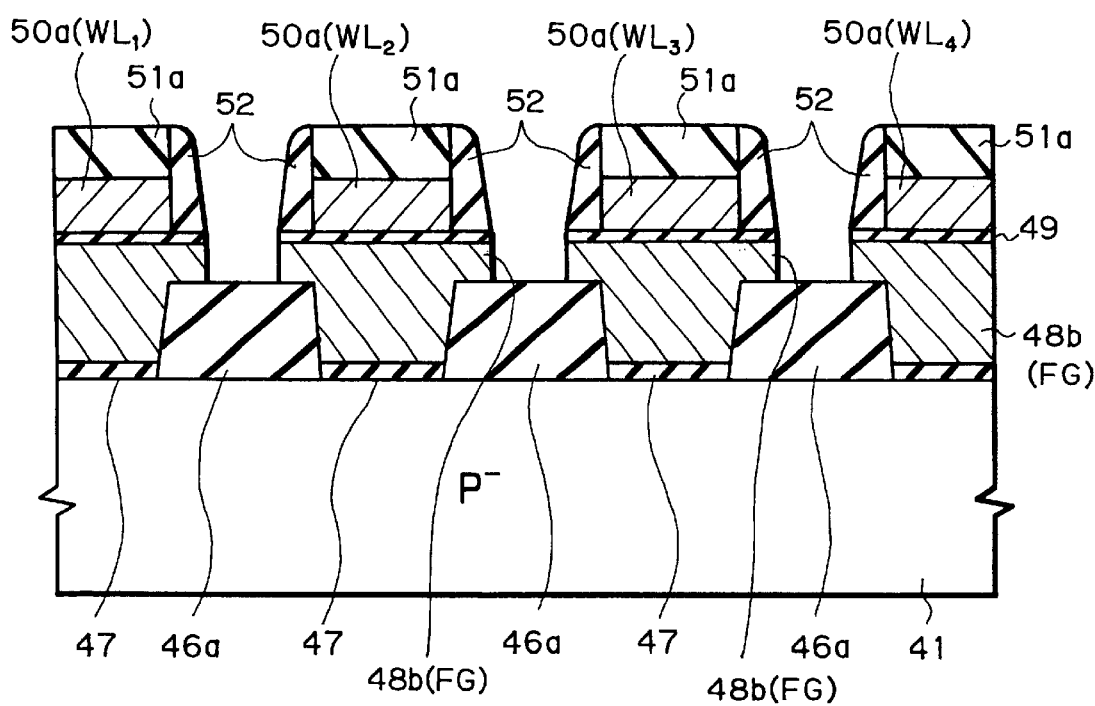

Next, referring to FIGS. 49A and 49B, the polycrystalline silicon layers 48a are patterned by an RIE process using the silicon oxide layers 51a and the sidewall silicon oxide layers 52 as a mask. In this case, the silicon oxide layers 46a serve as an etching stopper. Thus, patterned polycrystalline silicon layers 48b, i.e., the floating gate electrodes FG of FIG. 36 are obtained.

Figure 50A:
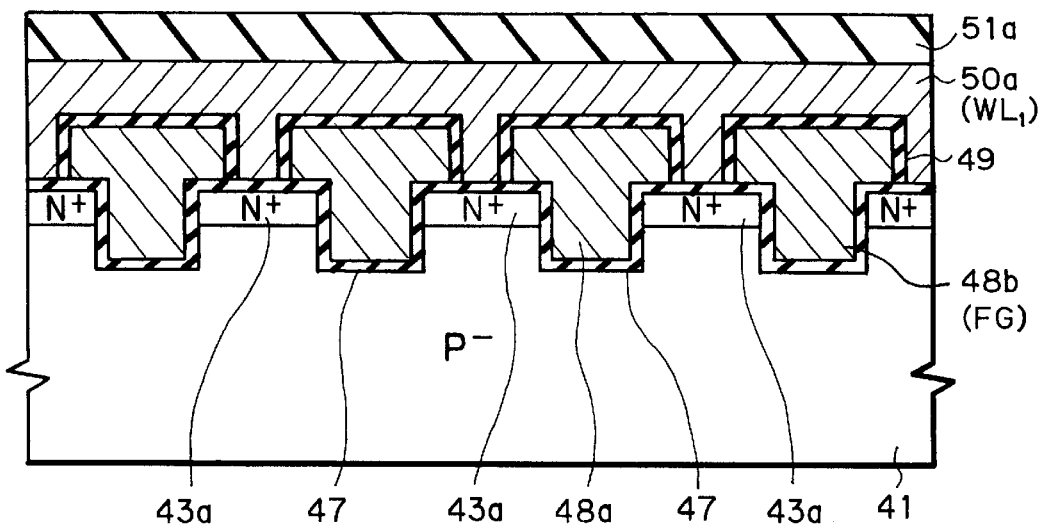
Figure 50B:
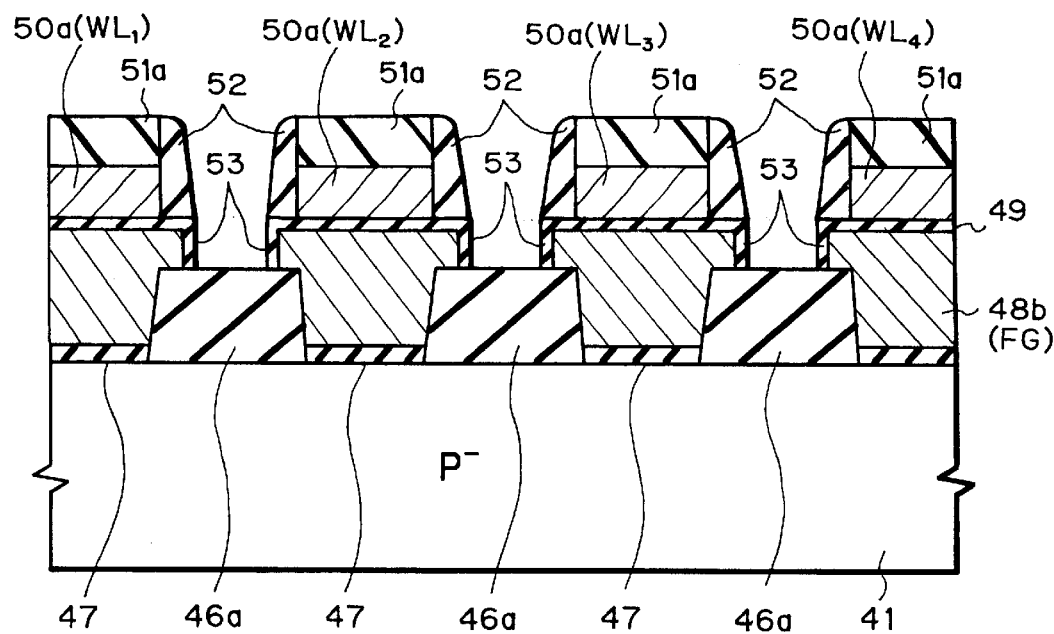

Next, referring to FIGS. 50A and 50B, a thermal oxidation is carried out, so that an about 10 nm thick silicon oxide layer 53 is grown on the sidewalls of the polycrystalline layers 48b (the floating gate electrodes FG).

Figure 51A:
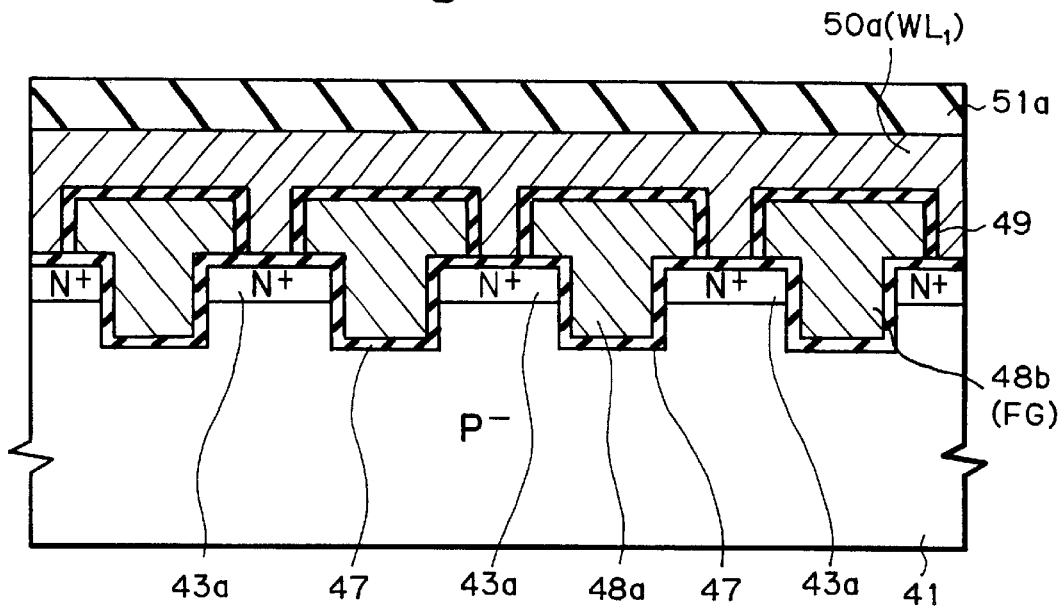
Figure 51B:
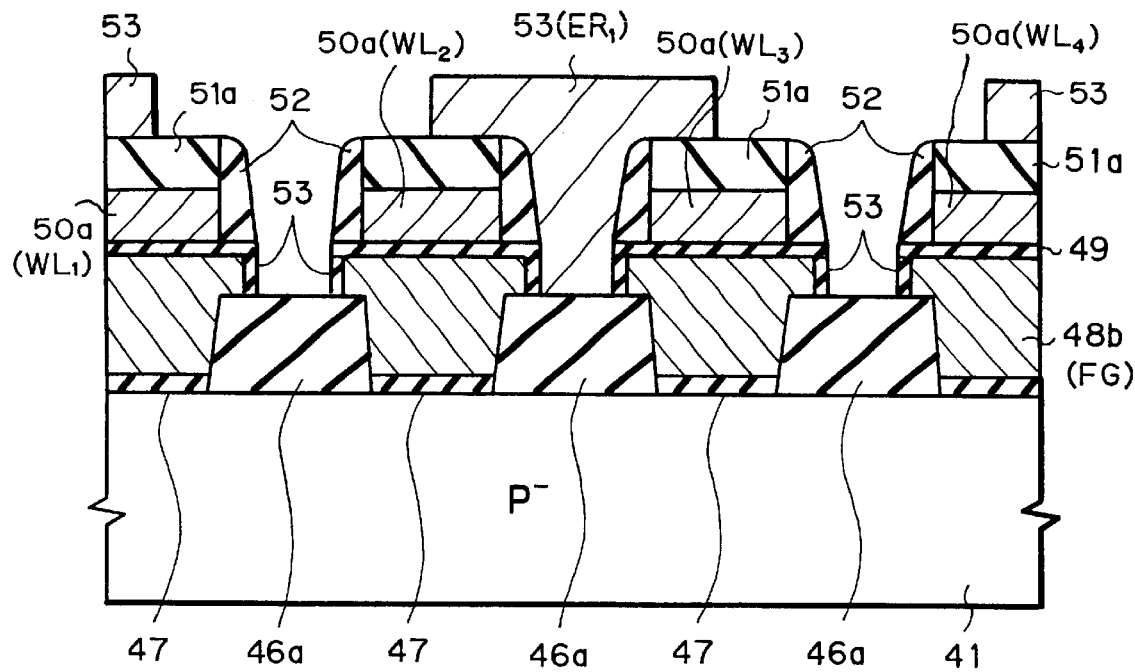

Next, referring to FIGS. 51A and 51B, a polycrystalline silicon layer 53 is deposited and patterned, so that the erase gate electrodes $ER_1$, . . . of FIG. 36 are obtained.

Figure 52A:
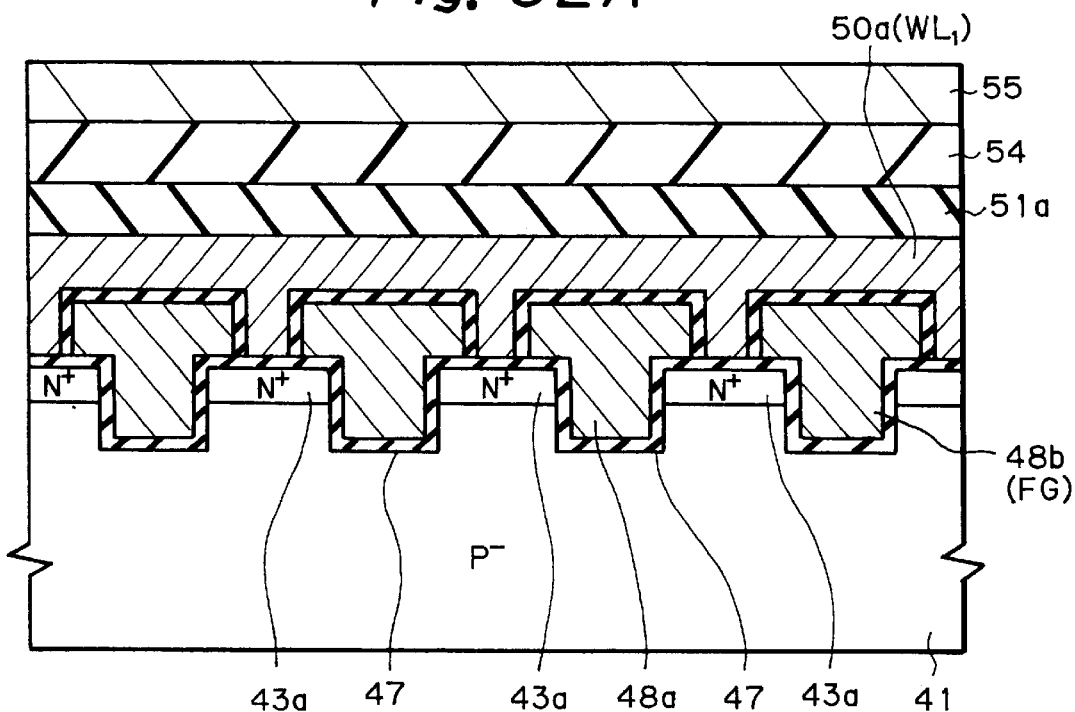
Figure 52B:
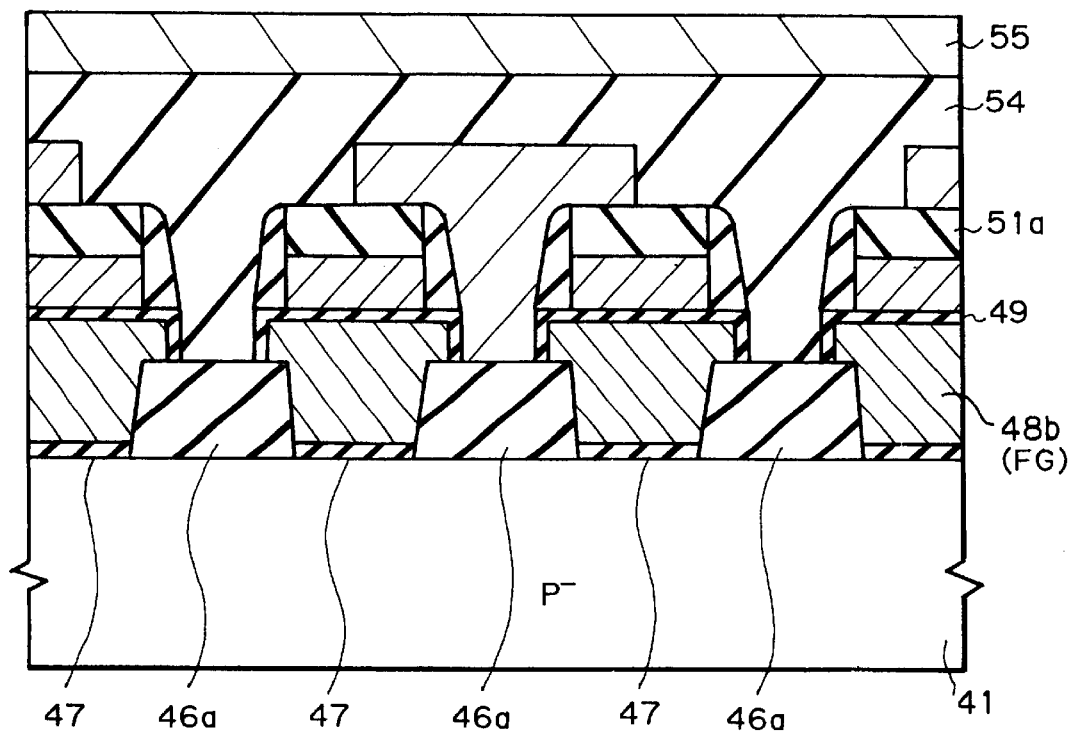

Next, referring to FIGS. 52A and 52B, a thick silicon oxide layer 54 is deposited by a CVD process, and then, a CMP operation is performed on the silicon oxide layer 54. Thus, the surface of the silicon oxide layer 54 is flattened.

Also, contact holes (riot shown) for the sub bit lines SBL$_1$, SBL$_2$, SBL$_3$, . . . are perforated in the layers 54 and 51a. Then, an aluminum layer 55 is deposited on the silicon oxide layer 54 by a sputtering process.

Figure 53A:
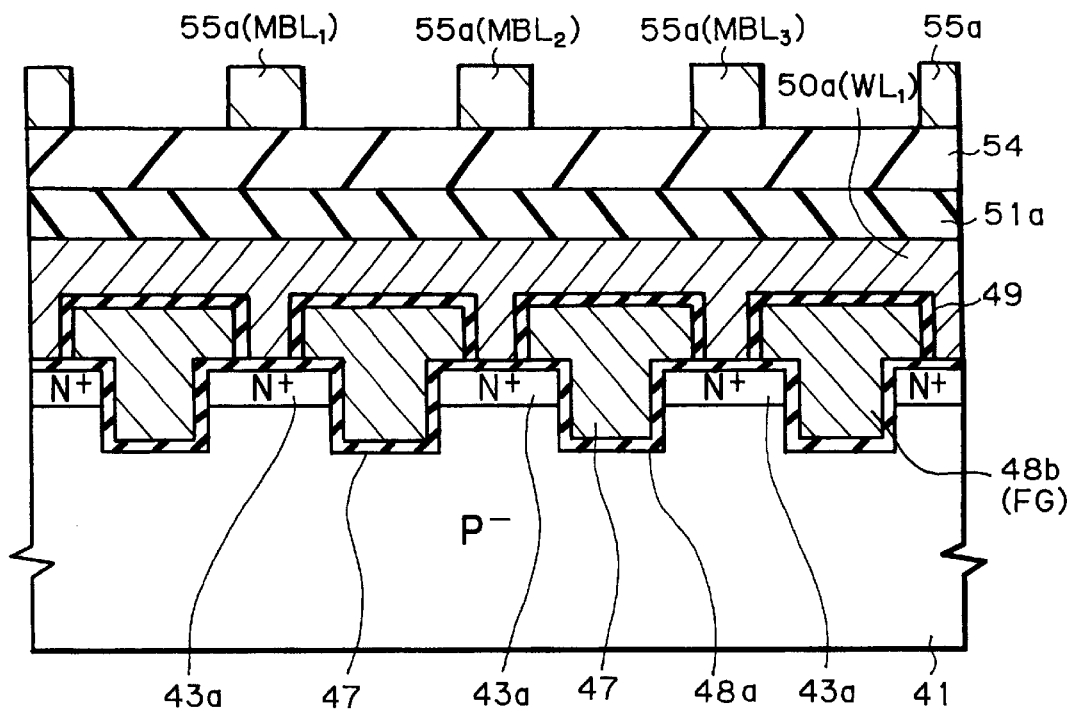
Figure 53B:
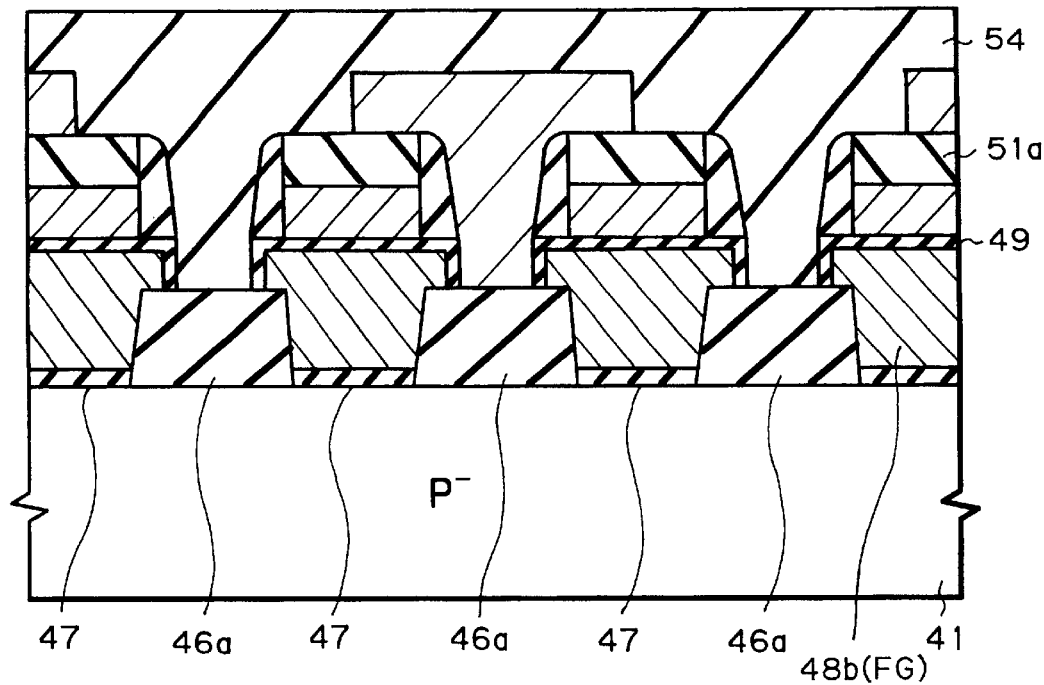

Finally, referring to FIGS. 53A and 53B, the aluminum layer 55 is patterned by a photolithography and etching process, so that patterned aluminum layers 55a, i.e., the main bit lines MBL$_1$, MBL$_2$ and MBL$_3$ of FIG. 36 are obtained.

Thus, the contactless virtual ground type flash nonvolatile semiconductor device of FIG. 36 is completed.

As explained hereinabove, according to the present invention, since grooves are provided between buried impurity diffusion layers for sub bit lines and sub source lines, even if the integration is advanced so that the spacing between the buried impurity diffusion layers becomes narrow, leakage current flowing therebetween can be suppressed. In addition, since insulating layers on the buried impurity diffusion layers are sufficiently thick, when patterning floating gate electrodes, the buried impurity diffusion layers are hardly etched, which can suppress the reduction of the read operation speed. Further, since the grooves serving as channel regions are in self-alignment with the buried impurity diffusion layers, the fluctuation of the operation characteristics of nonvolatile memory cells can be suppressed.

What is claimed is:

1. A method for manufacturing a contactless nonvolatile semiconductor memory device, comprising the steps of:
    preparing a semiconductor substrate of a first conductivity type;
    implanting impurity ions of a second conductivity type into said semiconductor substrate to form an impurity diffusion layer on said semiconductor substrate;
    forming a plurality of first insulating layers of a rectangular shape on said impurity diffusion layer;
    etching said impurity diffusion layer by using said first insulating layers as a mask to form rectangular impurity diffusion layers as sub bit lines;
    etching said semiconductor substrate by using said first insulating layers as a mask to form rectangular grooves in said semiconductor substrate;
    forming a first gate insulating layer on said semiconductor substrate at said grooves;
    forming a first conductive layer on said first gate insulating layer;
    patterning said first conductive layer to form first rectangular conductive layers over said grooves;
    forming a second gate insulating layer on said rectangular conductive layers;
    forming a second conductive layer on said second gate insulating layer;
    patterning said second conductive layer to form second rectangular conductive layers as word lines perpendicular to said sub bit lines; and
    etching said first rectangular conductive layers by a dry etching process using said word lines as a mask, to form floating gate electrodes.

2. The method as set forth in claim 1, further comprising the steps of:
    forming a second insulating layer on said word lines;
    forming a third conductive layer on said second insulating layer; and
    patterning said third conductive layer to form main bit lines each extending over one of said sub bit lines.

3. A method for manufacturing a contactless nonvolatile semiconductor memory device, comprising the steps of:
    preparing a semiconductor substrate of a first conductivity type;
    perforating a plurality of grooves of a rectangular shape in said semiconductor substrate;
    forming a first gate insulating layer on said semiconductor substrate at said grooves;
    forming a first conductive layer on said first gate insulating layer;
    patterning said first conductive layer to form first rectangular conductive layers over said grooves;
    implanting impurity ions of a second conductivity type into said semiconductor substrate by using said first rectangular conductive layers as a mask to form rectangular impurity diffusion layers as sub bit lines;
    forming a plurality of rectangular insulating layers on said rectangular impurity diffusion layers;
    forming a second gate insulating layer on said rectangular conductive layers;
    forming a second conductive layer on said second gate insulating layer;
    patterning said second conductive layer to form second rectangular conductive layers as word lines perpendicular to said sub bit lines; and
    etching said first rectangular conductive layers by a dry etching process using said word lines as a mask, to form floating gate electrodes.

4. The method as set forth in claim 3, further comprising the steps of:
    forming a second insulating layer on said word lines;
    forming a third conductive layer on said second insulating layer; and
    patterning said third conductive layer to form main bit lines each extending over one of said sub bit lines.

5. The method as set forth in claim 3, further comprising a step of implanting impurity ions of said first conductivity type into said semiconductor substrate by using said word lines and said rectangular insulating layers as a mask to form channel stoppers.

6. A method for manufacturing a contactless nonvolatile semiconductor memory device, comprising the steps of:
    preparing a semiconductor substrate of a first conductivity type;
    forming first and second isolation insulating layers of a rectangular shape on said semiconductor substrate by an LOCOS process;
    implanting impurity ions of a second conductivity type into said semiconductor substrate to form an impurity diffusion layer on said semiconductor substrate after said first and second isolation insulating layers are formed;
    forming a plurality of first insulating layers of a rectangular shape on said impurity diffusion layer and said first and second isolation insulating layers;
    etching said impurity diffusion layer by using said first insulating layers as a mask to form rectangular impurity diffusion layers as a first sub bit line, a sub source line and a second sub bit line between said first and second isolation insulating layers;
    etching said semiconductor substrate by using said first insulating layers as a mask to form rectangular grooves in said semiconductor substrate;

forming a first gate insulating layer on said semiconductor substrate at said grooves;

forming a first conductive layer on said first gate insulating layer;

patterning said first conductive layer to form first rectangular conductive layers over said grooves;

forming a second gate insulating layer on said rectangular conductive layers;

forming a second conductive layer on said second gate insulating layer;

patterning said second conductive layer to form second rectangular conductive layers as word lines perpendicular to said sub bit lines; and etching said first rectangular conductive layers by a dry etching process using said word lines as a mask, to form floating gate electrodes.

7. The method as set forth in claim 6, further comprising the steps of:

forming a second insulating layer on said word lines;

forming a third conductive layer on said second insulating layer; and patterning said third conductive layer to form main bit lines each extending over one of said sub bit lines.

8. A method for manufacturing a contactless nonvolatile semiconductor memory device, comprising the steps of:

preparing a semiconductor substrate of a first conductivity type;

forming first and second isolation insulating layers of a rectangular shape on said semiconductor substrate by a LOCOS process;

perforating a plurality of grooves of a rectangular shape in said semiconductor substrate between said first and second isolation insulating layers;

forming a first gate insulating layer on said semiconductor substrate at said grooves;

forming a first conductive layer on said first gate insulating layer;

patterning said first conductive layer to form first rectangular conductive layers over said grooves;

implanting impurity ions of a second conductivity type into said semiconductor substrate by using said first rectangular conductive layers as a mask to form rectangular impurity diffusion layers as a first sub bit line, a sub source line and a second sub bit line between said first arid second isolation insulating layers;

forming a plurality of rectangular insulating layers on said rectangular impurity diffusion layers;

forming a second gate insulating layer on said rectangular conductive layers;

forming a second conductive layer on said second gale insulating layer;

patterning said second conductive layer to form second rectangular conductive layers as word lines perpendicular to said sub bit lines; and etching said first rectangular conductive layers by a dry etching process using said word lines as a mask, to form floating gate electrodes.

9. The method as set forth in claim 8, further comprising the steps of:

forming a second insulating layer on said word lines;

forming a third conductive layer on said second insulating layer; and patterning said third conductive layer to form main bit lines each extending over one of said sub bit lines.

10. The method as set forth in claim 8, further comprising a step of implanting impurity ions of said first conductivity type into said semiconductor substrate by using said word lines and said rectangular insulating layers as a mask to form channel stoppers.

11. A method for manufacturing a contactless nonvolatile semiconductor memory device, comprising the steps of:

preparing a semiconductor substrate of a first conductivity type;

implanting impurity ions of a second conductivity type into said semiconductor substrate to form an impurity diffusion layer on said semiconductor substrate;

forming a plurality of first insulating layers of a rectangular shape on said impurity diffusion layer;

etching said impurity diffusion layer by using said first insulating layers as a mask to form rectangular impurity diffusion layers as sub bit lines;

etching said semiconductor substrate by using said first insulating layers as a mask to form rectangular grooves in said semiconductor substrate;

forming an insulating layer on said semiconductor substrate at said grooves;

patterning said insulating layer to form isolation insulating layers;

forming a first gate insulating layer on said semiconductor substrate at said grooves and said rectangular impurity diffusion layers;

forming a first conductive layer on said first gate insulating layer;

patterning said first conductive layer to form first rectangular conductive layers over said grooves;

forming a second gate insulating layer on said rectangular conductive layers;

forming a second conductive layer on said second gate insulating layer;

patterning said second conductive layer to form second rectangular conductive layers as word lines perpendicular to said sub bit lines; and etching said first; rectangular conductive layers by a dry etching process using said word lines as a mask, to form floating gate electrodes.

12. The method as set forth in claim 11, further comprising a step of:

forming sidewall insulating layers on said word lines before said floating gate electrodes are formed, said first rectangular conductive layer etching step using said word lines and said sidewall insulating layers as a mask.

13. The method as set forth in claim 11, further comprising the steps of:

forming third gate insulating layers on sidewalls of said floating gate electrodes; and forming erase gate electrodes on said-third gate insulating layers.

14. The method as set forth in claim 13, further comprising the steps of:

forming a second insulating layer on said erase gate electrodes;

forming a third conductive layer on said second insulating layer; and patterning said third conductive layer to form main bit lines each extending over one of said sub bit lines.

* * * * *